US010804877B2

(12) United States Patent
Ruby et al.

(10) Patent No.: US 10,804,877 B2
(45) Date of Patent: Oct. 13, 2020

(54) FILM BULK ACOUSTIC WAVE RESONATOR (FBAR) HAVING STRESS-RELIEF

(71) Applicant: Avago Technologies International Sales Pte. Limited, Singapore (SG)

(72) Inventors: Richard C. Ruby, Menlo Park, CA (US); Suresh Sridaran, Fort Collins, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 343 days.

(21) Appl. No.: 15/661,468

(22) Filed: Jul. 27, 2017

(65) Prior Publication Data

US 2017/0338799 A1 Nov. 23, 2017

Related U.S. Application Data

(63) Continuation-in-part of application No. 14/159,518, filed on Jan. 21, 2014, now Pat. No. 9,608,592, and a continuation-in-part of application No. 15/449,276, filed on Mar. 3, 2017.

(51) Int. Cl.
*H03H 9/17* (2006.01)
*H03H 9/54* (2006.01)
*H03H 9/13* (2006.01)

(52) U.S. Cl.
CPC ............ *H03H 9/173* (2013.01); *H03H 9/132* (2013.01); *H03H 9/171* (2013.01); *H03H 9/54* (2013.01)

(58) Field of Classification Search
CPC ......... H03H 9/173; H03H 9/171; H03H 9/132

USPC .................................................. 310/320, 322
See application file for complete search history.

(56) References Cited

U.S. PATENT DOCUMENTS

| | | |
|---|---|---|
| 5,587,620 A | 12/1996 | Ruby et al. |
| 5,873,153 A | 2/1999 | Ruby et al. |
| 5,910,756 A | 6/1999 | Ella |
| 6,107,721 A | 8/2000 | Lakin |
| 6,262,637 B1 | 7/2001 | Bradley et al. |
| 6,507,983 B1 | 1/2003 | Ruby et al. |
| 6,828,713 B2 | 12/2004 | Bradley et al. |
| 7,187,255 B2 | 3/2007 | Wang et al. |
| 7,280,007 B2 | 10/2007 | Feng et al. |
| 7,345,410 B2 | 3/2008 | Grannen et al. |
| 7,358,831 B2 | 4/2008 | Larson et al. |
| 7,369,013 B2 | 5/2008 | Fazzio et al. |
| 7,388,454 B2 | 6/2008 | Ruby et al. |
| 7,561,009 B2 | 7/2009 | Larson et al. |
| 7,629,865 B2 | 12/2009 | Ruby |

(Continued)

*Primary Examiner* — Derek J Rosenau
(74) *Attorney, Agent, or Firm* — Foley & Lardner LLP

(57) ABSTRACT

An acoustic resonator structure comprises: a substrate comprising a cavity having a plurality of sides; a first electrode disposed over the cavity; a first connection portion that connects to the first electrode over only one side of the plurality of sides of the cavity; a piezoelectric layer disposed over at least a portion of the first electrode; a second electrode disposed over the piezoelectric layer; and a second connection portion that connects to the second electrode over only the one side of the plurality of sides. The second connection portion does not overlap the first connection portion, and a contacting overlap of the first electrode, the piezoelectric layer and the second electrode provides an active area of the acoustic resonator.

20 Claims, 19 Drawing Sheets

(56) References Cited

U.S. PATENT DOCUMENTS

| | | |
|---|---|---|
| 7,714,684 B2 | 5/2010 | Ruby et al. |
| 7,791,434 B2 | 9/2010 | Fazzio et al. |
| 7,825,749 B2 | 11/2010 | Thalhammer et al. |
| 7,834,720 B2 | 11/2010 | Timme |
| 8,188,810 B2 | 5/2012 | Feng et al. |
| 8,230,562 B2 | 7/2012 | Fazzio et al. |
| 8,248,185 B2 | 8/2012 | Choy et al. |
| 8,258,894 B2 | 9/2012 | Thalhammer et al. |
| 8,330,325 B1 * | 12/2012 | Burak ................ H03H 9/585 310/320 |
| 8,436,516 B2 | 5/2013 | Ruby et al. |
| 8,902,023 B2 | 12/2014 | Choy et al. |
| 8,922,302 B2 | 12/2014 | Ruby et al. |
| 9,197,185 B2 | 11/2015 | Zou et al. |
| 2007/0205850 A1 | 9/2007 | Jamneala et al. |
| 2010/0237750 A1 * | 9/2010 | Sakashita ............. H03H 3/02 310/365 |
| 2010/0327994 A1 * | 12/2010 | Choy ............. H03H 9/02118 333/187 |
| 2011/0180391 A1 | 7/2011 | Larson et al. |
| 2011/0266925 A1 | 11/2011 | Ruby et al. |
| 2012/0177816 A1 | 7/2012 | Larson et al. |
| 2012/0218055 A1 * | 8/2012 | Burak ................. H03H 9/02 333/187 |
| 2012/0326807 A1 | 12/2012 | Choy et al. |
| 2013/0015747 A1 | 1/2013 | Ruby et al. |
| 2013/0049545 A1 | 2/2013 | Zou et al. |
| 2014/0118090 A1 | 5/2014 | Grannen et al. |
| 2014/0132117 A1 | 5/2014 | Larson et al. |
| 2014/0175950 A1 | 6/2014 | Zou et al. |
| 2014/0225682 A1 | 8/2014 | Burak et al. |
| 2014/0292150 A1 | 10/2014 | Zou et al. |
| 2014/0354109 A1 | 12/2014 | Grannen et al. |
| 2014/0368089 A1 * | 12/2014 | Omomo ................. H03H 3/02 310/348 |
| 2015/0244347 A1 | 8/2015 | Feng et al. |

* cited by examiner

FILM BULK ACOUSTIC WAVE RESONATOR (FBAR) HAVING STRESS-RELIEF

CROSS-REFERENCE TO RELATED APPLICATION

The present application is a continuation-in-part under 37 C.F.R. § 1.53(b) of, and claims priority under 35 U.S.C. § 120 from, commonly owned U.S. patent application Ser. No. 15/449,276 to Frank Bi, et al., entitled "Film Bulk Acoustic Wave Resonator (FBAR) Having Stress-Relief" and filed on Mar. 3, 2017. U.S. patent application Ser. No. 15/449,276 is a continuation of Ser. No. 14/159,518 (now U.S. Pat. No. 9,608,592) to Frank Bi, et al., entitled "Film Bulk Acoustic Wave Resonator (FBAR) Having Stress-Relief" and filed on Jan. 21, 2014. The present application also claims priority under 35 U.S.C. § 120 from Ser. No. 14/159,518 (now U.S. Pat. No. 9,608,592) based on this chain of continuity. The entire disclosures of U.S. patent application Ser. No. 14/159,518, U.S. Pat. No. 9,608,592, and Ser. No. 15/449,276 are specifically incorporated herein by reference, and for all purposes.

BACKGROUND

Acoustic resonators are used as oscillators in various electronic applications. An acoustic resonator can be characterized generally by a resonant frequency and acoustic coupling coefficient $kt^2$. However, due to a variety of intrinsic and extrinsic influences, the resonant frequency is not stable.

One source of frequency drift in acoustic resonators is physical stress. Physical stress can be caused, for example, by forces transmitted to the acoustic resonator through adjacent components. As an example, an acoustic resonator can be formed on a substrate of a known material, for example silicon, and comprising components made from various materials. As the substrate is heated and/or cooled, the substrate may expand or contract unevenly because the various components have different temperature coefficients of expansion. This uneven expansion or contraction can cause the substrate to change shape in a "potato chip" fashion. As the substrate changes shape, the substrate can transfer forces to the acoustic resonator through various intervening components. As these forces are transferred to the acoustic resonator, they will change the resonant frequency of the acoustic resonator, and can deleteriously impact operation of an electronic device that includes the acoustic resonator.

What is needed, therefore, are techniques for reducing frequency drift due to physical stresses in acoustic resonator structures.

BRIEF DESCRIPTION OF THE DRAWINGS

The described embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION OF EMBODIMENTS

Figure 1A:
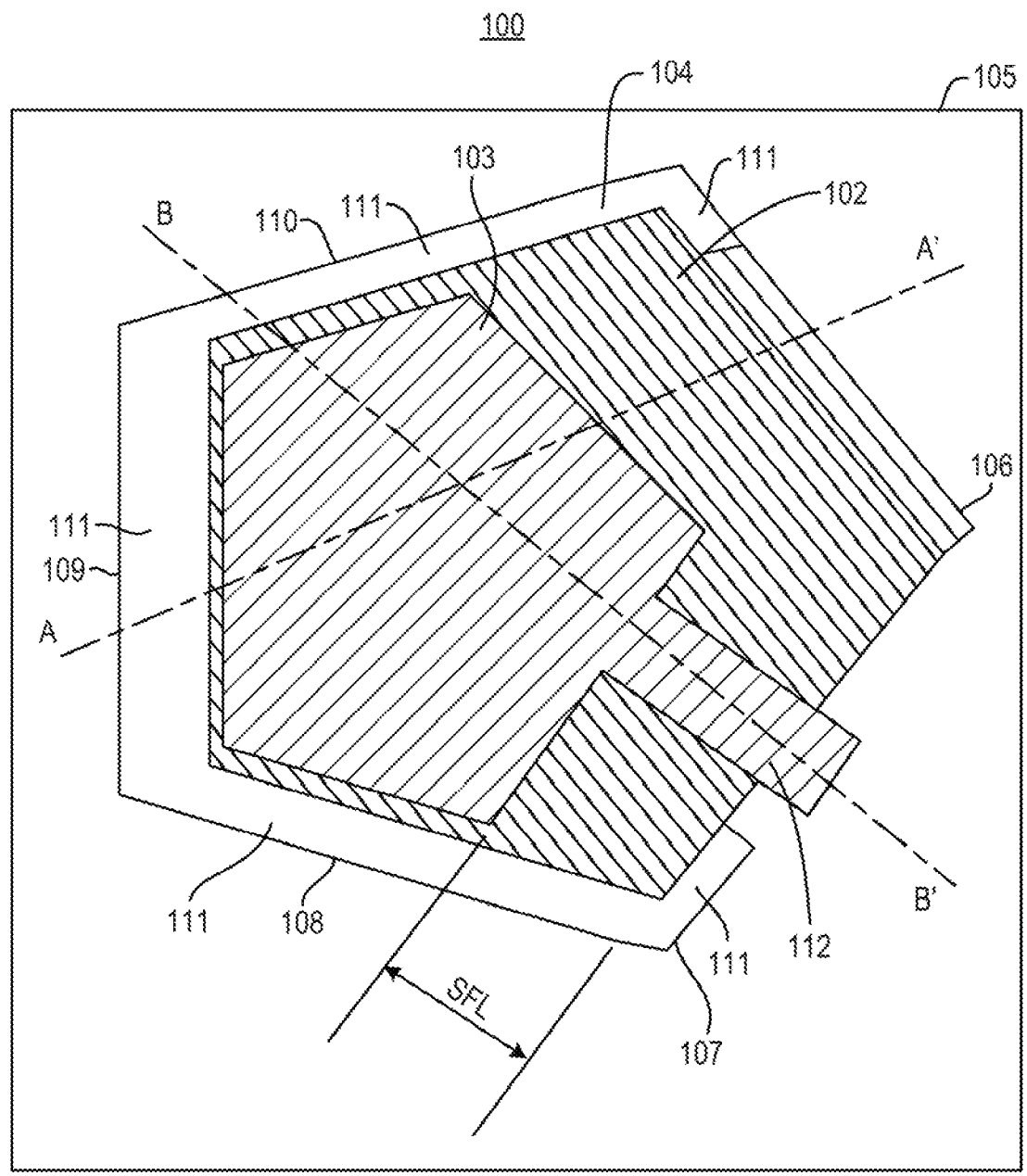
FIG. 1A is top view of an FBAR structure according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings. In addition, unless expressly so defined herein, terms are not to be interpreted in an overly idealized fashion. For example, the terms "isolation" or "separation" are not to be interpreted to require a complete lack of interaction between the described features.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to bulk acoustic wave (BAW) resonator structures with the acoustic stack formed over a cavity. These acoustic resonator structures can include various types of acoustic resonators, such as, for example, FBARs, zero drift resonators (ZDRs), double bulk acoustic resonators (DBARs), and coupled resonator filters (CRFs). In certain embodiments, the BAW resonator structures can be used to provide electrical filters (e.g., ladder filters).

Contemplated applications of the BAW resonators of the present teachings include, but are not limited to communication filter applications and MEMs applications. For example, the bulk acoustic wave (BAW) resonators of the present teachings may be arranged in a ladder-filter arrangement, such as described in U.S. Pat. No. 5,910,756 to Ella, and U.S. Pat. No. 6,262,637 to Bradley, et al., the disclosures of which are specifically incorporated herein by reference. Other types of electrical filters are contemplated by the present teachings, such as described in U.S. Pat. Nos. 8,258,894 and 7,825,749, to Thalhammer, et al; U.S. Pat. No. 7,834,720 to Timme; and U.S. Pat. No. 7,187,255 to Wang, et al. The entire disclosures of U.S. Pat. Nos. 8,258,894; 7,825,749; 7,834,720; and U.S. Pat. No. 7,187,255 are specifically incorporated herein by reference. The electrical filters may be used in a number of applications, such as in duplexers.

A variety of devices, structures thereof, materials and methods of fabrication are contemplated for the BAW resonators of the apparatuses of the present teachings. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629,865, 7,714,684, and 8,436,516 to Ruby et al; U.S. Pat. Nos. 7,369,013, 7,791,434 8,188,810, and 8,230,562 to Fazzio, et al; U.S. Pat. No. 7,280,007 to Feng et al; U.S. Pat. Nos. 8,248,185, and 8,902,023 to Choy, et al; U.S. Pat. No. 7,345,410 to Grannen, et al; U.S. Pat. No. 6,828,713 to Bradley, et al; U.S. Pat. Nos. 7,561,009 and 7,358,831 to Larson, III et al; U.S. Pat. No. 9,197,185 to Zou, et al., U.S. Patent Application Publication No. 20120326807 to Choy, et al; U.S. Patent Application Publications Nos. 20110180391 and 20120177816 to Larson III, et al; U.S. Patent Application Publication No. 20070205850 to Jamneala et al; U.S. Patent Application Publication No. 20110266925 to Ruby, et al; U.S. Patent Application Publication No. 20130015747 to Ruby, et al; U.S. Patent Application Publication No. 20130049545 to Zou, et al; U.S. Patent Application Publication No. 20140225682 to Burak, et al; U.S. Patent Publication No. 20140132117 to John L. Larson III; U.S. Patent Publication Nos.: 20140118090 and 20140354109 John L. Larson III, et al; U.S. Patent Application Publication Nos. 20140292150, and 20140175950 to Zou, et al; and U.S. Patent Application Publication No. 20150244347 to Feng, et al. The entire disclosure of each of the patents, and patent application publications listed above are hereby specifically incorporated by reference herein. It is emphasized that the components, materials and methods of fabrication described in these patents and patent applications are representative, and other methods of fabrication and materials within the purview of one of ordinary skill in the art are also contemplated.

Representative embodiments described below relate to an FBAR structure comprising an active area that is suspended over a cavity formed in a substrate, and that is not in contact with the sides of the cavity. The active area of the FBAR is supported in various ways so that forces transmitted to the substrate produce minimal physical stress on the active area of the FBAR. In other words, the active area of the FBAR is substantially mechanically isolated from the substrate to prevent the active area from being influenced by surrounding forces. In this manner, the amount of frequency drift in the FBAR due to physical stress is reduced compared to known FBARs. Moreover, acoustic wave leakage along the sides of the cavity is reduced, which results in reduced energy loss, and an increase in the quality (Q) factor of the FBAR compared to certain known resonators.

Certain embodiments described below can be used in electronic applications such as low power radios for wireless applications, GPS devices, and imaging devices, to name but a few. Some embodiments are particularly relevant to high accuracy devices requiring resonators with minimal frequency drift. For example, some embodiments can be used to displace existing technologies such as existing Quartz resonators used in oscillators and in GPS devices.

FIG. 1A is top view of an FBAR structure 100 according to a representative embodiment. The FBAR structure 100 comprises a first electrode 101, a piezoelectric layer 102 and a second electrode 103 stacked over one another. It is noted that for convenience of explanation, the piezoelectric layer 102 is depicted in FIG. 1A as being transparent so that certain features of the first electrode 101 can be described. The piezoelectric layer 102 is not transparent. Moreover, an optional passivation layer, which is described below, may be provided over the uppermost layers of the FBAR structure 100, and is not shown in FIG. 1A to better present the description of the arrangement of the layers of the FBAR structure 100.

The FBAR structure 100 comprises a cavity 104 formed in a substrate 105. The cavity 104 comprises a plurality of sides 106~110, where often, but not necessarily, the number of the plurality of sides 106~110 is the same as the number of sides of the first and second electrodes 101, 103.

In a region 111, the piezoelectric layer 102 is removed or otherwise not formed. As described more fully below, piezoelectric layer 102 disposed over at least a portion of the first electrode 101, and extends from beyond at least one edge of the first electrode 101 and over at least one of the plurality of sides 106~110 having the first electrode 101 extending thereover.

In a representative embodiment, the substrate 105 comprises silicon (Si) or similar material. Generally, the cavity 104 comprises air, and is formed by a known method. The first electrode 101 and the second electrode 103 are comprised of a suitable electrically conductive material such as tungsten (W) or molybdenum (Mo). The piezoelectric layer 102 can comprise, for example, aluminum nitride (AlN), zinc oxide (ZnO), or lead zirconium titanate (PZT). Generally, the piezoelectric layer 102 comprises a highly-textured c-axis piezoelectric material where the c-axis orientations of the crystals of the piezoelectric material are well-collimated, and as such are parallel with one another and perpendicular to the plane of the electrodes (e.g., first and second electrodes 101, 103).

Many of the details of the materials contemplated for use as the substrate 105, first electrode 101, piezoelectric layer 102 and second electrode 103, thicknesses of these materials, and details of the methods of manufacture of the FBAR structure 100 are known and are tailored to a particular application. Many of these details are described, for example, in one or more of the patents, patent application publications and patent applications incorporated by reference above. Often, these details are not repeated in order to avoid obscuring the description of the present teachings.

As can be seen in FIG. 1A, the second electrode 103 does not overlap the entirety of either the first electrode 101 or the piezoelectric layer 102. Rather, the second electrode 103 overlaps only a portion of the area of the first electrode 101 and the piezoelectric layer 102. Moreover, in the representative embodiment depicted in FIG. 1A, the second electrode 103 of the FBAR structure 100 does not extend over any of the plurality of sides 106~110 of the cavity 104 formed in the substrate 105. As such, the active area of the FBAR structure 100, which is defined as the area of contacting overlap of the second electrode 103, the piezoelectric layer 102, the first electrode 101 and the cavity 104, is suspended over the cavity 104. In the suspended active area of FBAR structure 100, an electrical connection is made to the second electrode 103 via a bridge 112 that extends over the piezoelectric layer 102 and the first electrode 101 and connects to contact 113 disposed over the substrate 105. Illustratively, the bridge 112 is formed according to the teachings of the above-referenced, commonly owned U.S. Pat. No. 8,248,825 to Choy, et al. As depicted in FIG. 1A, a signal feed line (SFL) length is a measure of the distance between the active area of the FBAR structure 100 and its contact side(s) with the substrate 105.

The greater the SFL length, the more remote the active area of the FBAR structure 100 is from its contact side(s) (often referred to as the "anchor side(s)" or "feeding side(s)") with the substrate 105 and the influence of stress induced on the substrate 105. As such, the length of the bridge 112 is made large compared to known bridges and signal feeds between external contacts to the FBAR structure. Illustratively, the SFL length is at least 25 µm, and typically can be approximately 10 µm to approximately 100 µm or more. Other structures, such as a double-bridge arrangement described below, can be implemented to provide a suitable SFL length and thus, beneficial mechanical isolation of the active area of the FBAR structures of representative embodiments.

By this arrangement, the active area of the FBAR structure 100 is substantially mechanically isolated from the contact or anchor side on the substrate 105, and therefore, is not significantly susceptible to mechanical stress from the substrate 105. Beneficially, this substantial isolation of the active area of the FBAR structure 100 from mechanical stress from the contact side or anchor side(s) with the substrate 105 reduces the drift of the resonator frequency of the FBAR structure 100.

Figure 1B:
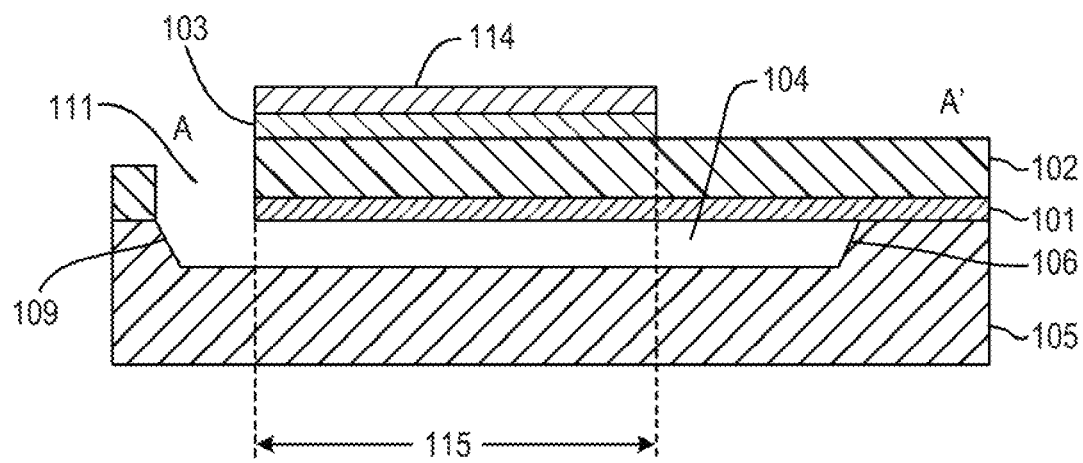
FIG. 1B is a cross-sectional view of the FBAR structure of FIG. 1A taken along the line A-A' of FIG. 1A.

FIG. 1B is a cross-sectional view of the FBAR structure 100 of FIG. 1A taken along the line A-A' of FIG. 1A. The FBAR structure 100 comprises the first electrode 101, the piezoelectric layer 102 and the second electrode 103 disposed over the cavity 104 in the substrate 105. In a representative embodiment, a passivation layer 114 (not shown in FIG. 1A) is disposed over the second electrode 103. The passivation layer 114 can be formed of various types of materials, including aluminum nitride, silicon carbide, BSG, $SiO_2$, SiN, polysilicon, and the like. The thickness of the passivation layer 114 should generally be sufficient to insulate the layers of FBAR structure 100 from the environment, including protection from moisture, corrosives, contaminants, and debris.

As depicted in FIG. 1B, an active area 115 of the FBAR structure 100 consists of the contacting overlap of the first electrode 101, the piezoelectric layer 102, the second electrode 103 and the cavity 104. The active area 115 is substantially suspended over the cavity 104 and is supported by the portion of the first electrode 101 that extends over the side 106 of the cavity 104. However, the first electrode 101 does not extend across side 109 of the cavity 104, and the piezoelectric layer 102 is removed or otherwise not formed in region 111. As such, the active area 115 is supported at side 106 of the cavity 104, and is substantially mechanically isolated from the substrate 105 as a result.

Figure 1C:
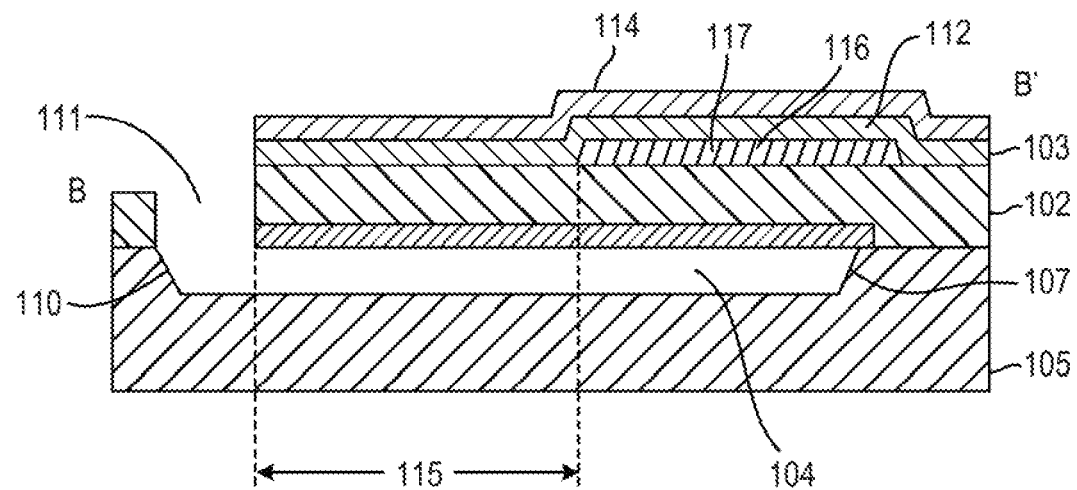
FIG. 1C is a cross-sectional view of the FBAR structure of FIG. 1A taken along the line B-B' of FIG. 1A.

FIG. 1C is a cross-sectional view of the FBAR structure 100 of FIG. 1A taken along the line B-B' of FIG. 1A. The FBAR structure 100 comprises the first electrode 101, the piezoelectric layer 102 and the second electrode 103 disposed over the cavity 104 in the substrate 105. As depicted in FIG. 1C, the active area 115 of the FBAR structure 100 is substantially suspended over the cavity 104 and is supported by the portion of the first electrode 101 that extends over the side 107 of the cavity 104. However, the first electrode 101 does not extend across side 110 of the cavity 104, and the piezoelectric layer 102 is removed or otherwise not formed in region 111. As such, the active area 115 is supported at side 107 of the cavity 104, and is substantially mechanically isolated from the substrate 105 as a result.

As depicted in FIG. 1C, the bridge 112 is physically separated from the piezoelectric layer 102 by space 116, and as such terminates the contacting overlap of the first electrode 101, the piezoelectric layer 102 and the second electrode 103, and as such terminates the active area 115 of the FBAR structure 100. In a representative embodiment, the space 116 is empty, comprising only air. In other representative embodiments, the space 116 is filled with a non-conductive dielectric material 117 that improves the mechanical strength of the bridge and provides thermal resistance to the substrate 105, which generally comprises silicon. Non-conductive dielectric material 117 may be silicon dioxide, which has much greater thermal resistance than pure silicon, or non-etchable boro-silica glass (NEBSG). Other materials within the purview of one of ordinary skill in the art having the benefit of the present disclosure are also contemplated for use as the non-conductive dielectric material 117.

In the presently described representative embodiment, the active area 115 of the FBAR structure 100 is supported through the mechanical connection of the first electrode 101 to the substrate 105 over sides 106 and 107 of the cavity 104, and remains unconnected to the remaining sides 108, 109 and 110 of the cavity 104. It is emphasized that this is merely illustrative, and the active area 115 may be supported through the mechanical connection of the first electrode 101 to the substrate 105 on only one of the plurality of sides 106~110. As should be appreciated by one of ordinary skill in the art, the fewer the number of sides of the first electrode 101 to the substrate 105, the better the mechanical isolation of the active area 115 from the substrate 105. As such, in representative embodiments, the first electrode 101 is mechanically connected to the substrate 105 through extension of the first electrode 101 over at least one of the plurality of sides 106~110 of the substrate 105, but connections to substrate 105 by the extension of first electrode 101 over more than two of the plurality of sides 106~110 is generally avoided.

As noted above, and as depicted in FIG. 1B, the piezoelectric layer 102 is disposed over at least a portion of the first electrode 101, and extends over at least one of the plurality of sides 106~110 of the cavity 104 having the first electrode 101 extending thereover. So, for example, in the presently described embodiment, the piezoelectric layer 102 is provided over the first electrode 101 and both the first electrode 101 and the piezoelectric layer 102 extend over sides 106 and 107 of the substrate 105. The extension of the piezoelectric layer 102 over side 106 provides mechanical robustness to the FBAR structure 100, and beneficially reduces the susceptibility of the FBAR structure 100 to mechanical failure or fatigue, especially over time.

Figure 2A:
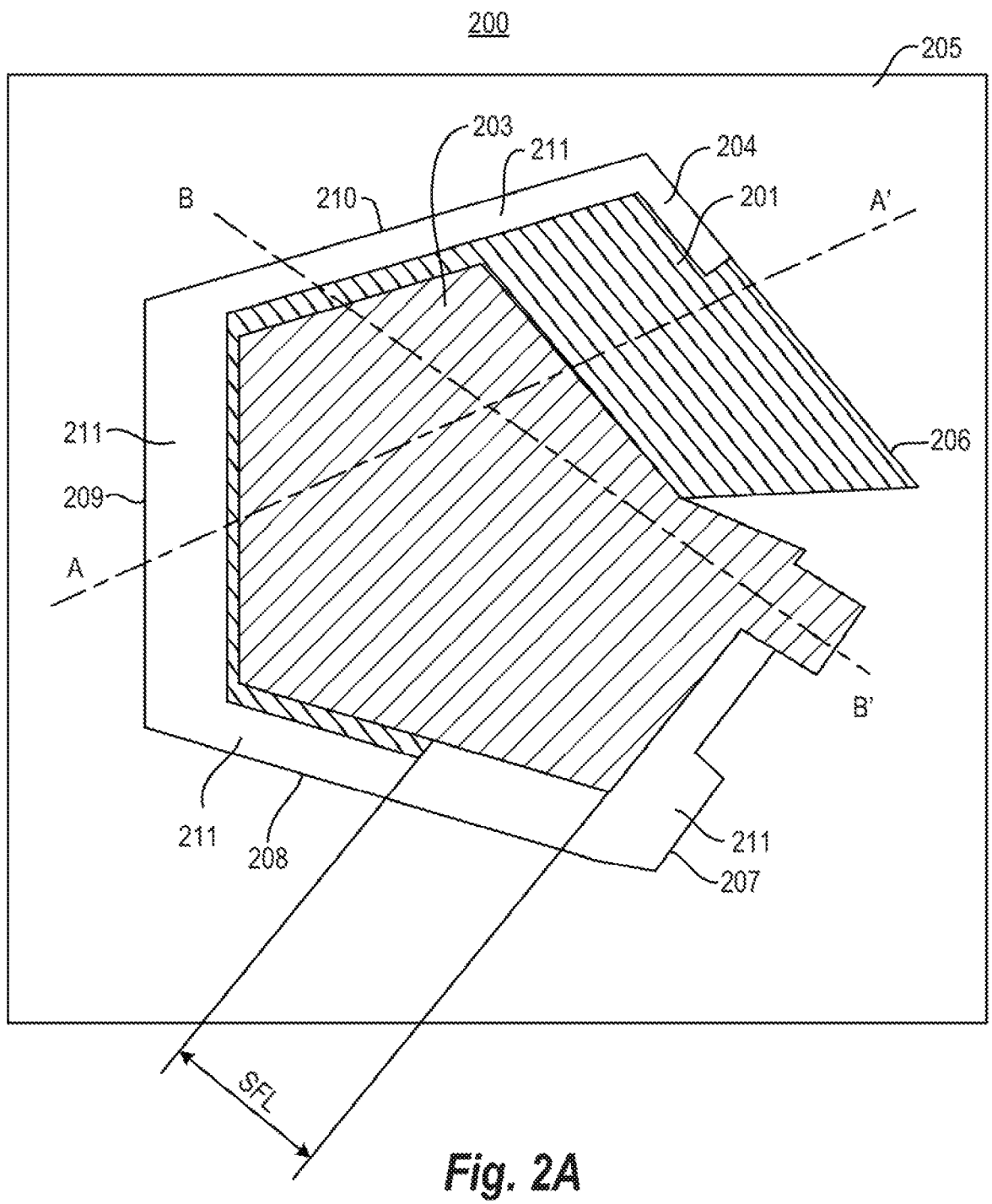
FIG. 2A is top view of an FBAR structure according to a representative embodiment.

FIG. 2A is a top view of an FBAR structure 200 according to a representative embodiment. Many details of the FBAR structure 200 are substantively the same as those provided in the description of FBAR structure 100. These details are not always repeated in order to avoid obscuring the description of the presently described representative embodiments.

The FBAR structure 200 comprises a first electrode 201, a piezoelectric layer 202 and a second electrode 203 stacked over one another. It is noted that for convenience of explanation, the piezoelectric layer 202 is depicted in FIG. 2A as being transparent so that certain features of the first electrode 201 can be described. The piezoelectric layer 202 is not transparent. Moreover, an optional passivation layer, which is described below, may be provided over the uppermost layers of the FBAR structure 200, and is not shown in FIG. 2A to better present the description of the arrangement of the layers of the FBAR structure 200.

The FBAR structure 200 comprises a cavity 204 formed in a substrate 205. The cavity 204 comprises a plurality of sides 206~210, where often, but not necessarily, the number of the plurality of sides 206~110 is the same as the number of sides of the first and second electrodes 201, 203.

In a region 211, the piezoelectric layer 202 is removed or otherwise not formed. As described more fully below, piezoelectric layer 202 disposed over at least a portion of the first electrode 201, and extends from beyond at least one edge of the first electrode 201 and over at least one of the plurality of sides 206~110 having the first electrode 201 extending thereover.

As can be seen in FIG. 2A, the second electrode 203 does not overlap the entirety of either the first electrode 201 or the piezoelectric layer 202. Rather, the second electrode 203 overlaps only a portion of the area of the first electrode 201 and the piezoelectric layer 202. Moreover, in the representative embodiment depicted in FIG. 2A, the second electrode 203 of the FBAR structure 200 does not extend over any of the plurality of sides 206~210 of the cavity 204 formed in the substrate 205. As such, the active area of the FBAR structure 200, which is defined as the area of contacting overlap of the second electrode 203, the piezoelectric layer 202, the first electrode 201 and the cavity 204, is suspended over the cavity 204. As depicted in FIG. 2A, the SFL length is comparatively large by the extension of the second electrode 203 from side 207. As described more fully below, by this beneficial arrangement, the active area of the FBAR structure 200 is substantially mechanically isolated from the contact side with the substrate 205, and therefore, is not susceptible to mechanical stress from the substrate 205. Beneficially, this substantial isolation of the active area of the FBAR structure 200 from mechanical stress of the substrate 205 reduces the drift of the resonant frequency f the FBAR structure 200.

Figure 2B:
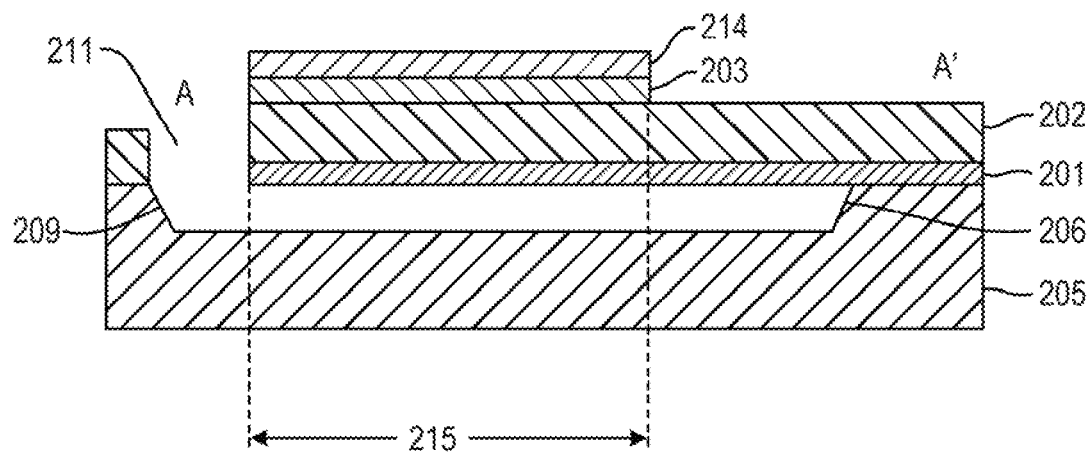
FIG. 2B is a cross-sectional view of the FBAR structure of FIG. 2A taken along the line A-A' of FIG. 2A.

FIG. 2B is a cross-sectional view of the FBAR structure 200 of FIG. 2A taken along the line A-A' of FIG. 2A. The FBAR structure 200 comprises the first electrode 201, the piezoelectric layer 202 and the second electrode 203 disposed over the cavity 204 in the substrate 205. In a representative embodiment, a passivation layer 214 (not shown in FIG. 2A) is disposed over the second electrode 203. The passivation layer 214 can be formed of various types of materials, including aluminum nitride, silicon carbide, BSG, $SiO_2$, SiN, polysilicon, and the like. The thickness of the passivation layer 214 should generally be sufficient to insulate the layers of FBAR structure 200 from the environment, including protection from moisture, corrosives, contaminants, and debris.

As depicted in FIG. 2B, an active area 215 of the FBAR structure 200 consists of the contacting overlap of the first electrode 201, the piezoelectric layer 202, the second electrode 203 and the cavity 204. The active area 215 is substantially suspended over the cavity 204 and is supported by the portion of the first electrode 201 that extends over the side 206 of the cavity 204. However, the first electrode 201 does not extend across side 209 of the cavity 204, and the piezoelectric layer 202 is removed or otherwise not formed in region 211. As such, the active area 215 is supported at side 206 of the cavity 204, and is substantially mechanically isolated from the substrate 205 as a result.

Figure 2C:
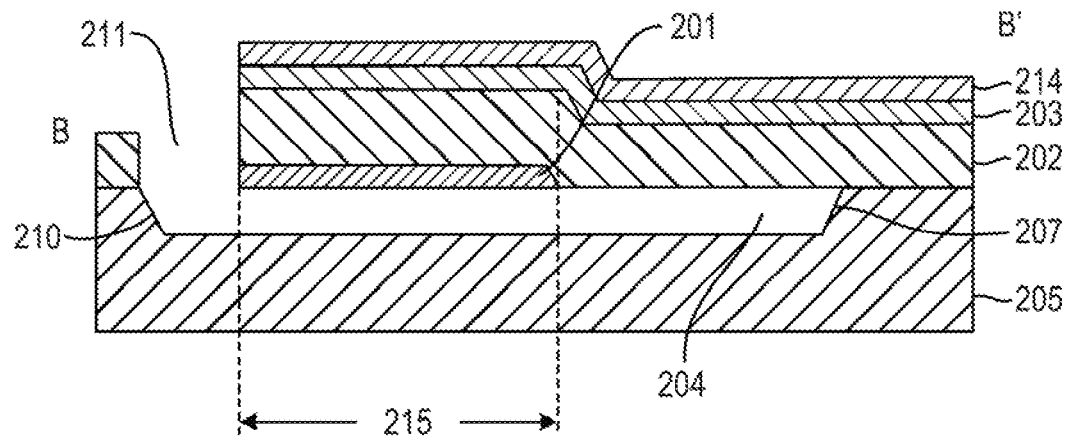
FIG. 2C is a cross-sectional view of the FBAR structure of FIG. 2A taken along the line B-B' of FIG. 2A.

FIG. 2C is a cross-sectional view of the FBAR structure 200 of FIG. 2A taken along the line B-B' of FIG. 2A. The FBAR structure 200 comprises the first electrode 201, the piezoelectric layer 202 and the second electrode 203 disposed over the cavity 204 in the substrate 205. As depicted in FIG. 2C, the active area 215 of the FBAR structure 200 is substantially suspended over the cavity 204. Notably, the piezoelectric layer 202 extends over the side 207, with the first electrode 201 terminating over the cavity 204 as depicted. However, the first electrode 201 does not extend across either side 207 or 210 of the cavity 204, and the piezoelectric layer 202 is removed or otherwise not formed in region 211. As such, the active area 215 is supported at side 206 of the cavity 204, and is substantially mechanically isolated from the substrate 205 as a result.

In the presently described representative embodiment, the active area 215 of the FBAR structure 200 is supported through the mechanical connection of the first electrode 201 to the substrate 205 over side 206 of the cavity 204, and remains unconnected to the remaining sides 207, 208, 209 and 210 of the cavity 204. As such, in the presently described representative embodiment, the active area 215 is supported through the mechanical connection of the first electrode 201 to the substrate 205 on only one of the plurality of sides 206~210. As should be appreciated by one of ordinary skill in the art, the fewer the number of sides of the first electrode 201 to the substrate 205, the better the mechanical isolation of the active area 215 from the substrate 205. As such, in representative embodiments, the first electrode 201 is mechanically connected to the substrate 205 through extension of the first electrode 201 over at least one of the plurality of sides 206~210 of the substrate 205, but connections to substrate 205 by the extension of first electrode 201 over more than two of the plurality of sides 206~120 is generally avoided.

As noted above, and as depicted in FIG. 2B, the piezoelectric layer 202 is disposed over at least a portion of the first electrode 201, and extends over at least one of the plurality of sides 206~210 of the cavity 204 having the first electrode 201 extending thereover. So, for example, in the presently described embodiment, the piezoelectric layer 202 is provided over the first electrode 201 and both the first electrode 201 and the piezoelectric layer 202 extend over side 206 of the substrate 205. The extension of the piezoelectric layer 202 over side 206 provides mechanical robustness to the FBAR structure 200, and beneficially reduces the susceptibility of the FBAR structure 200 to mechanical stress from the substrate 205.

Figure 3A:
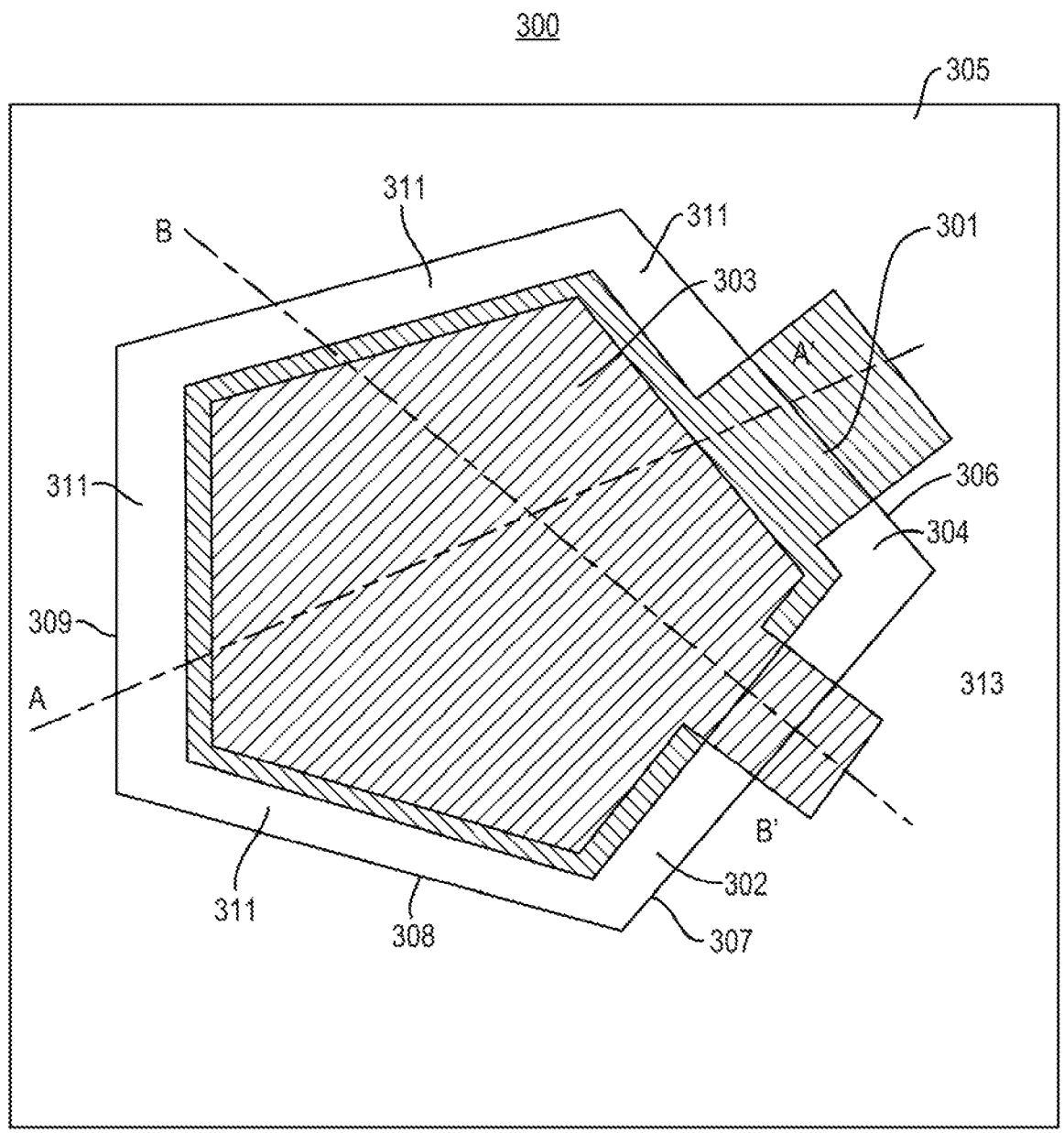
FIG. 3A is top view of an FBAR structure according to a representative embodiment.

FIG. 3A is top view of an FBAR structure 300 according to a representative embodiment. Many details of the FBAR structure 300 are substantively the same as those provided in the description of FBAR structures 100, 200. These details are not always repeated in order to avoid obscuring the description of the description of the presently described representative embodiments.

The FBAR structure 300 comprises a first electrode 301, a piezoelectric layer 302 and a second electrode 303 stacked over one another. It is noted that for convenience of explanation, the piezoelectric layer 302 is depicted in FIG. 3A as being transparent so that certain features of the first electrode 301 can be described. The piezoelectric layer 302 is not transparent.

The FBAR structure 300 comprises a cavity 304 formed in a substrate 305. The cavity comprises a plurality of sides 306~310, where generally the number of the plurality of sides 306~110 is the same as the number of sides of the first and second electrodes 301, 303.

In a region 111, the piezoelectric layer 302 is removed or otherwise not formed. As described more fully below, piezoelectric layer 302 disposed over at least a portion of the first electrode 301, and extends from beyond at least one edge of the first electrode 301 and over at least one of the plurality of sides 306~110 having the first electrode 301 extending thereover.

As can be seen in FIG. 3A, the second electrode 303 does not overlap the entirety of either the first electrode 301 or the piezoelectric layer 302. Rather, the second electrode 303 overlaps only a portion of the area of the first electrode 301 and the piezoelectric layer 302. Moreover, in the representative embodiment depicted in FIG. 3A, the second electrode 303 of the FBAR structure 300 does not extend over any of the plurality of sides 306~110 of the cavity 304 formed in the substrate 305. As such, the active area of the FBAR structure 300, which is defined as the area of contacting overlap of the second electrode 303, the piezoelectric layer 302, the first electrode 301 and the cavity 304, is suspended over the cavity 304. As described more fully below, by this beneficial arrangement, the active area of the FBAR structure 300 is substantially mechanically isolated from the substrate 305, and therefore, is not susceptible to mechanical stress from the substrate 305. Beneficially, this substantial isolation of the active area of the FBAR structure 300 from mechanical stress of the substrate 305 reduces the drift of the center frequency and bandwidth of the FBAR structure 300.

Figure 3B:
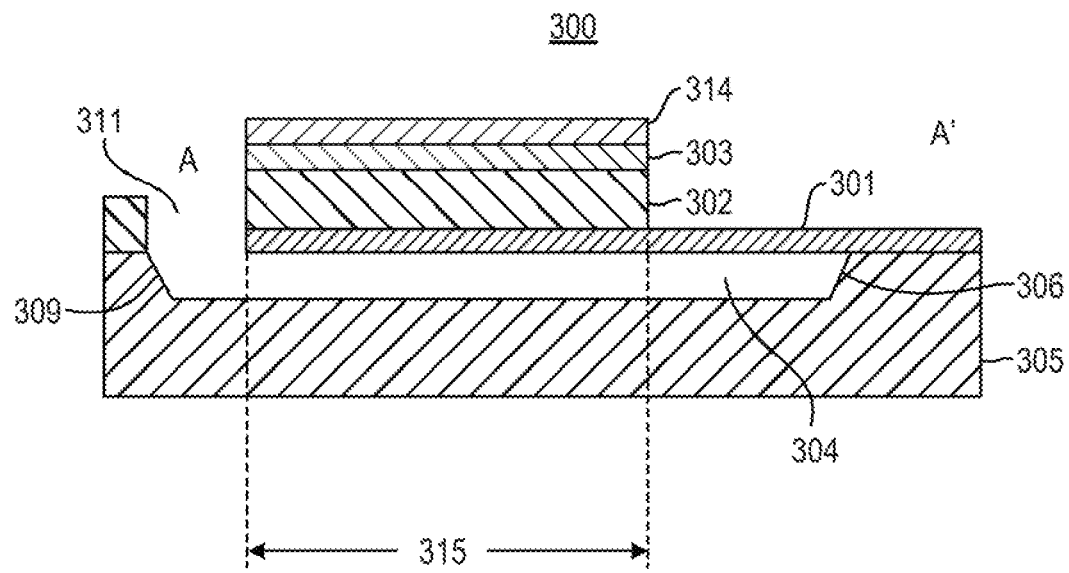
FIG. 3B is a cross-sectional view of the FBAR structure of FIG. 3A taken along the line A-A' of FIG. 3A.

FIG. 3B is a cross-sectional view of the FBAR structure 300 of FIG. 3A taken along the line A-A' of FIG. 3A. The FBAR structure 300 comprises the first electrode 301, the piezoelectric layer 302 and the second electrode 303 disposed over the cavity 304 in the substrate 305. In a representative embodiment, a passivation layer 314 (not shown in FIG. 3A) is disposed over the second electrode 303. The passivation layer 314 can be formed of various types of materials, including aluminum nitride, silicon carbide, BSG, $SiO_2$, SiN, polysilicon, and the like. The thickness of the passivation layer 314 should generally be sufficient to insulate the layers of FBAR structure 300 from the environment, including protection from moisture, corrosives, contaminants, and debris.

As depicted in FIG. 3B, an active area 315 of the FBAR structure 300 consists of the contacting overlap of the first electrode 301, the piezoelectric layer 302, the second electrode 303 and the cavity 304. The active area 315 is substantially suspended over the cavity 304 and is supported by the portion of the first electrode 301 that extends over the side 306 of the cavity 304 and over the substrate 305. However, the first electrode 301 does not extend across side 309 of the cavity 304, and the piezoelectric layer 302 is removed or otherwise not formed in region 311. As such, the active area 315 is supported at side 306 of the cavity 304, and is substantially mechanically isolated from the substrate 305 as a result. Moreover, and in contrast to FBAR structures 100, 200 described in connection with representative embodiments above, the piezoelectric layer 302 is removed or otherwise not formed so as to not extend over the side 306 of the cavity 304 or over the substrate 305. Beneficially, by not extending the piezoelectric layer 302 over the side 306 and over the substrate 305, mechanical isolation of the active area 315 from the mechanical stresses/forces on the substrate 305 is further improved.

Figure 3C:
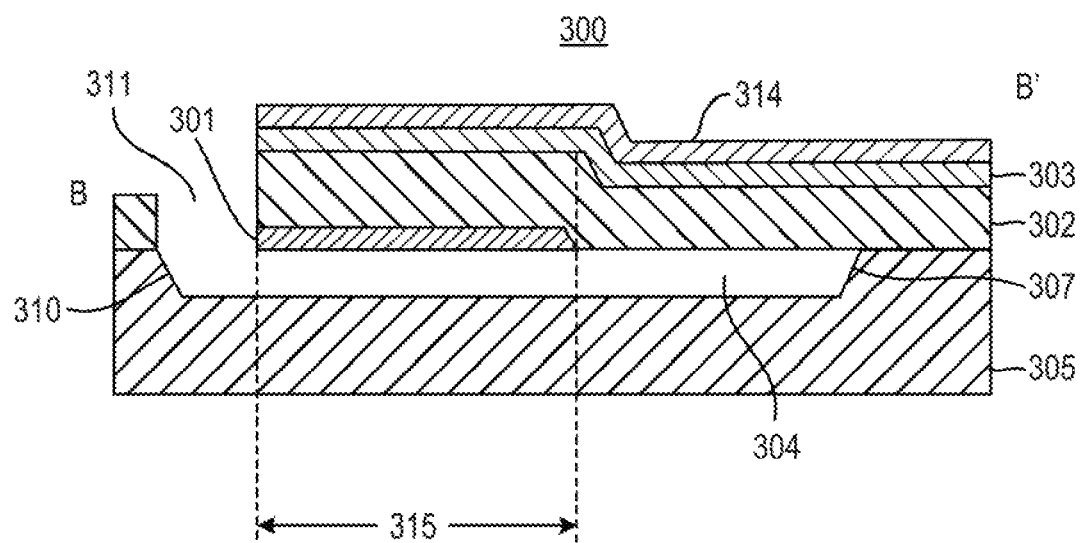
FIG. 3C is a cross-sectional view of the FBAR structure of FIG. 3A taken along the line B-B' of FIG. 3A.

FIG. 3C is a cross-sectional view of the FBAR structure 300 of FIG. 3A taken along the line B-B' of FIG. 3A. The FBAR structure 300 comprises the first electrode 301, the piezoelectric layer 302 and the second electrode 303 disposed over the cavity 304 in the substrate 305. As depicted in FIG. 3C, the active area 315 of the FBAR structure 300 is substantially suspended over the cavity 304. Notably, the piezoelectric layer 302 extends over the side 307, with the first electrode 301 terminating over the cavity 304 as depicted. However, the first electrode 301 does not extend over either side 307 or 310 of the cavity 304 or over the substrate 305, and the piezoelectric layer 302 is removed or otherwise not formed in region 311. As such, the active area 315 is supported by the first electrode 301 only at side 306 of the cavity 304, and is substantially mechanically isolated from the substrate 305 as a result.

In the presently described representative embodiment, the active area 315 of the FBAR structure 300 is supported through the mechanical connection of the first electrode 301 to the substrate 305 over side 306 of the cavity 304, and remains unconnected to the remaining sides 307, 308, 309 and 310 of the cavity. As such, in the presently described representative embodiment, the active area 315 is supported through the mechanical connection of the first electrode 301 to the substrate 305 on only one of the plurality of sides 306~310. As should be appreciated by one of ordinary skill in the art, the fewer the number of sides of the first electrode 301 connected to the substrate 305, the better the mechanical isolation of the active area 315 from the substrate 305. As such, in representative embodiments, the first electrode 301 is mechanically connected to the substrate 305 through extension of the first electrode 301 over at least one of the plurality of sides 306~310 of the substrate 305, but connections to substrate 305 by the extension of first electrode 301 over more than two of the plurality of sides 306~310 is generally avoided.

As noted above, and as depicted in FIG. 3B, the piezoelectric layer 302 is disposed over at least a portion of the first electrode 301, and extends over at least one of the plurality of sides 306~310 of the cavity 304. So, for example, in the presently described representative embodiment, the piezoelectric layer 302 is provided over the first electrode 301, but only the piezoelectric layer 302 extends over side 307 of the substrate 305. The extension of the piezoelectric layer 302 over side 307 provides mechanical robustness to the FBAR structure 300, and beneficially reduces the susceptibility of the FBAR structure 300 to mechanical failure or fatigue, especially over time.

Figure 4A:
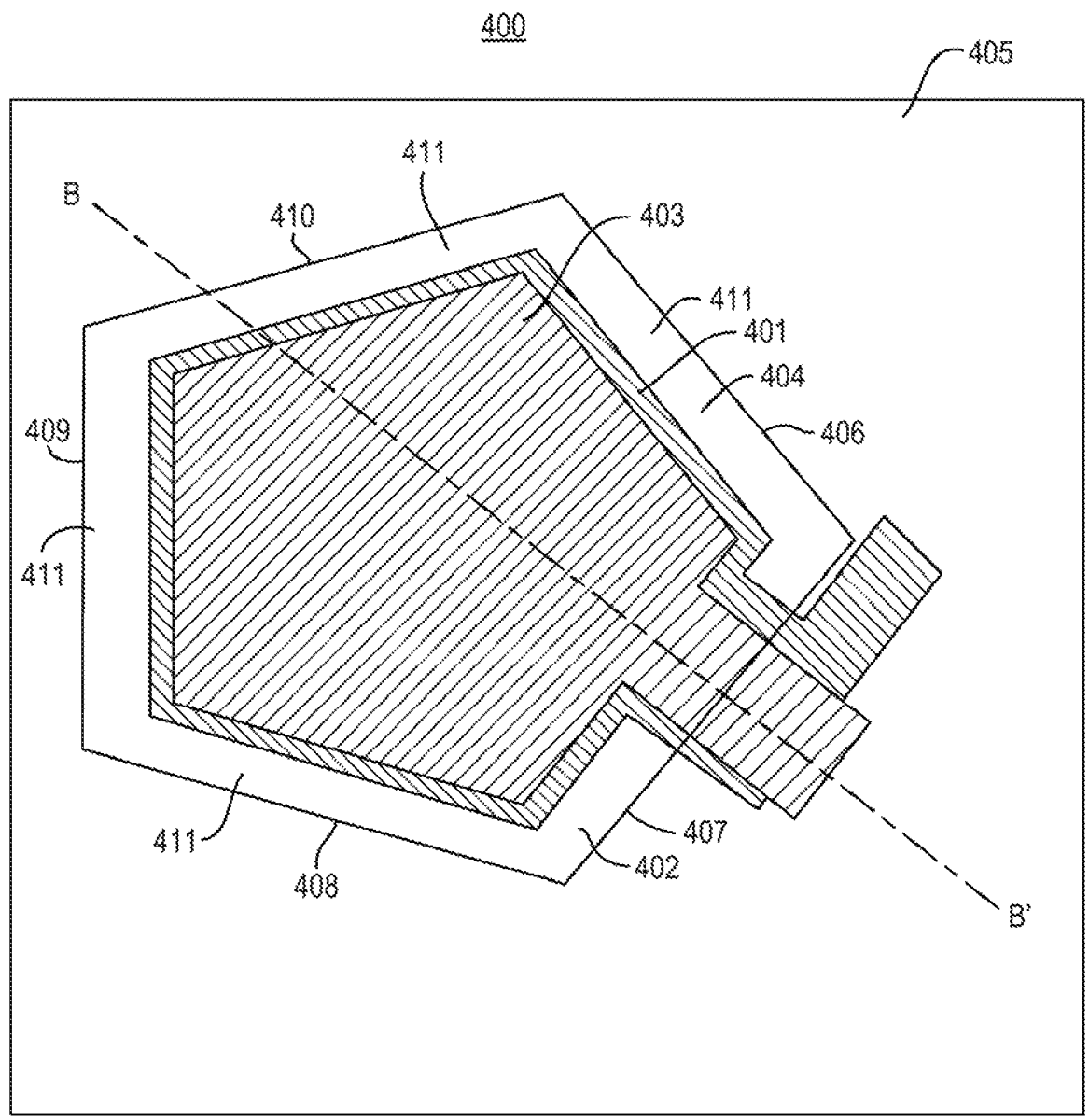
FIG. 4A is top view of an FBAR structure according to a representative embodiment.

FIG. 4A is top view of an FBAR structure 400 according to a representative embodiment. Many details of the FBAR structure 400 are substantively the same as those provided in the description of FBAR structures 100~300. These details are not always repeated in order to avoid obscuring the description of the presently described representative embodiments.

The FBAR structure 400 comprises a first electrode 401, a piezoelectric layer 402 and a second electrode 403 stacked over one another. It is noted that for convenience of explanation, the piezoelectric layer 402 is depicted in FIG. 4A as being transparent so that certain features of the first electrode 401 can be described. The piezoelectric layer 402 is not transparent. Moreover, an optional passivation layer, which is described below, may be provided over the uppermost layers of the FBAR structure 400, and is not shown in FIG. 4A to better present the description of the arrangement of the layers of the FBAR structure 400.

The FBAR structure 400 comprises a cavity 404 formed in a substrate 405. The cavity comprises a plurality of sides 406~410, where generally the number of the plurality of sides 406~410 is the same as the number of sides of the first and second electrodes 401, 403.

In a region 411, the piezoelectric layer 402 is removed or otherwise not formed. As described more fully below, piezoelectric layer 402 is disposed over at least a portion of the first electrode 401, and extends from beyond at least one edge of the first electrode 401 and over at least one of the plurality of sides 406~110 having the first electrode 401 extending thereover.

As can be seen in FIG. 4A, the second electrode 403 does not overlap the entirety of either the first electrode 401 or the piezoelectric layer 402. Rather, the second electrode 403 overlaps only a portion of the area of the first electrode 401 and the piezoelectric layer 402. Moreover, in the representative embodiment depicted in FIG. 4A, the second electrode 403 of the FBAR structure 400 does not extend over any of the plurality of sides 406~110 of the cavity 404 formed in the substrate 405. As such, the active area of the FBAR structure 400, which is defined as the area of contacting overlap of the second electrode 403, the piezoelectric layer 402, the first electrode 401 and the cavity 404, is suspended over the cavity 404. As described more fully below, by this beneficial arrangement, the active area of the FBAR structure 400 is substantially mechanically isolated from the substrate 405, and therefore, is not susceptible to significant mechanical stress from the substrate 405. Beneficially, this substantial isolation of the active area of the FBAR structure 400 from mechanical stress of the substrate 405 reduces the drift of the center frequency and bandwidth of the FBAR structure 400.

Figure 4B:
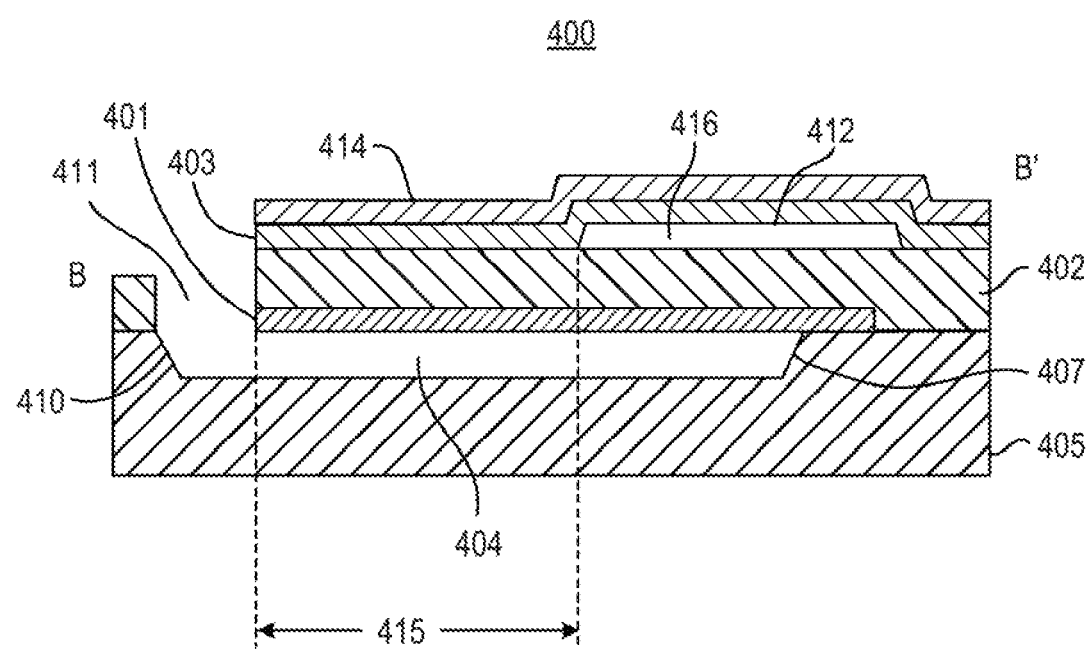
FIG. 4B is a cross-sectional view of the FBAR structure of FIG. 4A taken along the line B-B' of FIG. 4A.

FIG. 4B is a cross-sectional view of the FBAR structure 400 of FIG. 4A taken along the line B-B' of FIG. 4A. The FBAR structure 400 comprises the first electrode 401, the piezoelectric layer 402 and the second electrode 403 disposed over the cavity 404 in the substrate 405. In the suspended active area structure of FBAR structure 400, an electrical connection is made to the second electrode 403 via a bridge 412 that extends over the piezoelectric layer 402 and the first electrode 401. Illustratively, the bridge 412 is formed according to the teachings of the above-referenced, commonly owned U.S. Pat. No. 8,248,825 to Choy, et al. As depicted in FIG. 4B, the bridge 412 is physically separated from the piezoelectric layer 402 by space 416, and as such terminates the active area of the FBAR structure 400. In a representative embodiment, the space 416 is empty, comprising only air. In other representative embodiments, the space 416 is filled with a non-conductive dielectric material (not shown in FIG. 4B) that provides thermal resistance to the substrate 405, which generally comprises silicon.

In a representative embodiment, a passivation layer 414 (not shown in FIG. 4A) is disposed over the second electrode 403. The passivation layer 414 can be formed of various types of materials, including aluminum nitride, silicon carbide, BSG, $SiO_2$, SiN, polysilicon, and the like. The thickness of the passivation layer 414 should generally be sufficient to insulate the layers of FBAR structure 400 from the environment, including protection from moisture, corrosives, contaminants, and debris.

As depicted in FIG. 4B, the active area 415 of the FBAR structure 400 is substantially suspended over the cavity 404. Notably, both the first electrode 401 and the piezoelectric layer 402 extend over the side 407. The extension of the piezoelectric layer 402 over side 407 provides mechanical robustness to the FBAR structure 400, and beneficially reduces the susceptibility of the FBAR structure 400 to mechanical failure or fatigue, especially over time. However, the first electrode 401 does not extend over side 406, 408, 409 or 410 of the cavity 404 or over the substrate 405, and the piezoelectric layer 402 is removed or otherwise not formed in region 411. As such, the active area 415 is supported by the first electrode 401 only at side 407 of the cavity 404, and is substantially mechanically isolated from the substrate 405 as a result.

In the presently described representative embodiment, the active area 415 of the FBAR structure 400 is supported through the mechanical connection of the first electrode 401 to the substrate 405 over side 407 of the cavity 404, and remains unconnected to the remaining sides 406, 408, 409 and 410 of the cavity. As such, in the presently described representative embodiment, the active area 415 is supported through the mechanical connection of the first electrode 401 to the substrate 405 on only one of the plurality of sides 406~410. As should be appreciated by one of ordinary skill in the art, the fewer the number of sides of the first electrode 401 to the substrate 405, the better the mechanical isolation of the active area 415 from the substrate 405. As such, in representative embodiments, the first electrode 401 is mechanically connected to the substrate 405 through extension of the first electrode 401 over at least one of the plurality of sides 406~410 of the substrate 405, but connections to substrate 405 by the extension of first electrode 401 over more than two of the plurality of sides 406~410 is generally avoided.

Figure 5A:
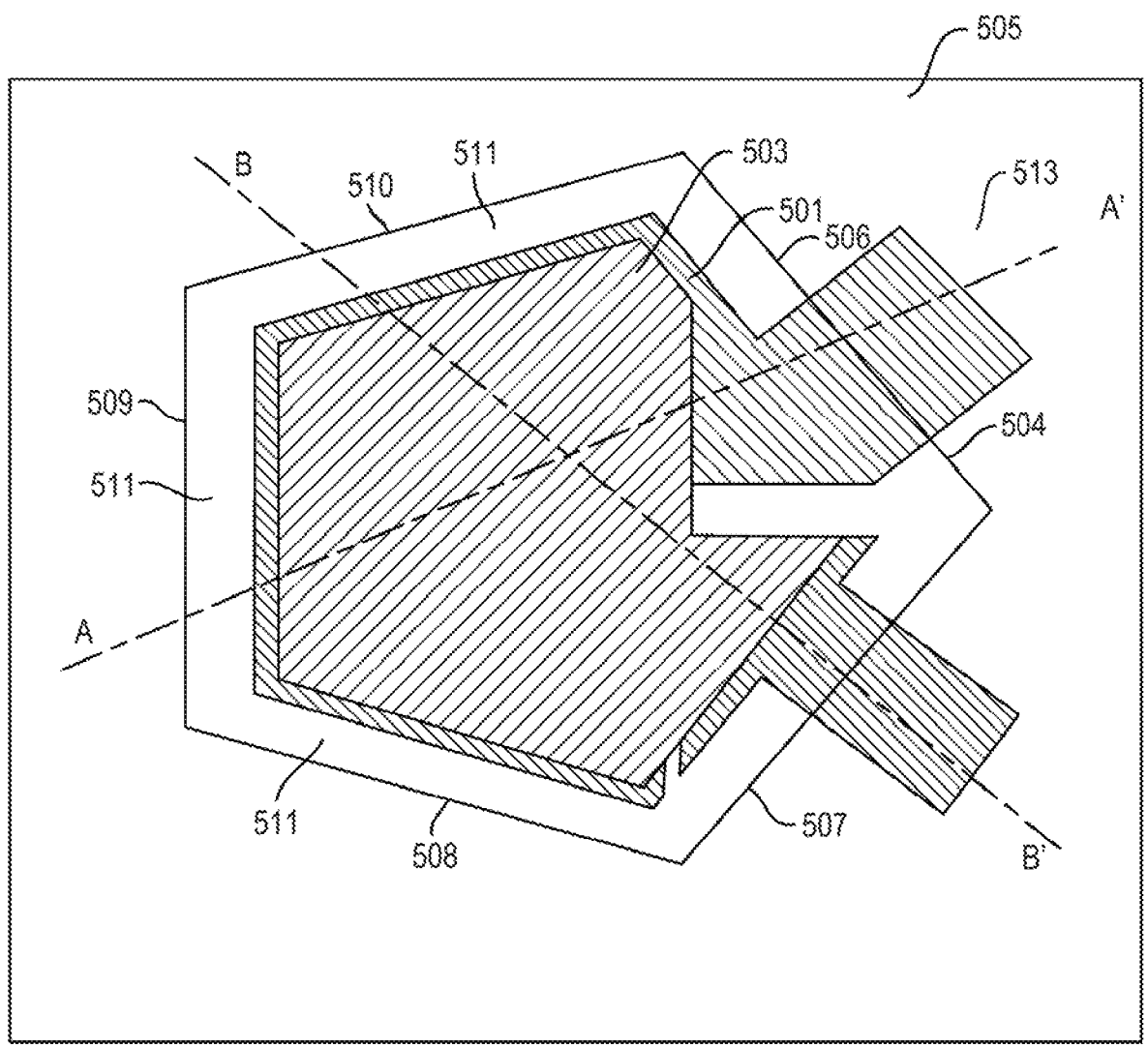
FIG. 5A is top view of an FBAR structure according to a representative embodiment.

FIG. 5A is top view of an FBAR structure 500 according to a representative embodiment. Many details of the FBAR structure 500 are substantively the same as those provided in the description of FBAR structures 100~400. These details are not always repeated in order to avoid obscuring the description of the description of the presently described representative embodiments.

The FBAR structure 500 comprises a first electrode 501, a piezoelectric layer 502 (not shown in FIG. 5A) and a second electrode 503 stacked over one another. The FBAR structure 500 comprises a cavity 504 formed in a substrate 505. The cavity comprises a plurality of sides 506~510, where in the presently described representative embodiment, the first and second electrodes 501, 503 each have one more sides than the plurality of sides 506~510. In the present embodiment, the additional side of the first and second electrodes 501, 503 allows for the connection of a portion of the first electrode 501 to the second electrode 503, as described below.

In a region 511, the piezoelectric layer 502 is removed or otherwise not formed. As described more fully below, the piezoelectric layer 502 is disposed over at least a portion of the first electrode 501, and extends from beyond at least one edge of the first electrode 501 and over at least one of the plurality of sides 506~110 having the first electrode 501 extending thereover.

As can be seen in FIG. 5A, the second electrode 503 does not overlap the entirety of either the first electrode 501 or the piezoelectric layer 502. Rather, the second electrode 503 overlaps only a portion of the area of the first electrode 501 and the piezoelectric layer 502. Moreover, in the representative embodiment depicted in FIG. 5A, the second electrode 503 of the FBAR structure 500 does not extend over any of the plurality of sides 506~110 of the cavity 504 formed in the substrate 505. As such, the active area of the FBAR structure 500, which is defined as the area of contacting overlap of the second electrode 503, the piezoelectric layer 502, the first electrode 501 and the cavity 504, is suspended over the cavity 504. As described more fully below, by this beneficial arrangement, the active area of the FBAR structure 500 is substantially mechanically isolated from the substrate 505, and therefore, is not susceptible to mechanical stress from the substrate 505. Beneficially, this substantial isolation of the active area of the FBAR structure 500 from mechanical stress of the substrate 505 reduces the drift of the center frequency and bandwidth of the FBAR structure 500.

Figure 5B:
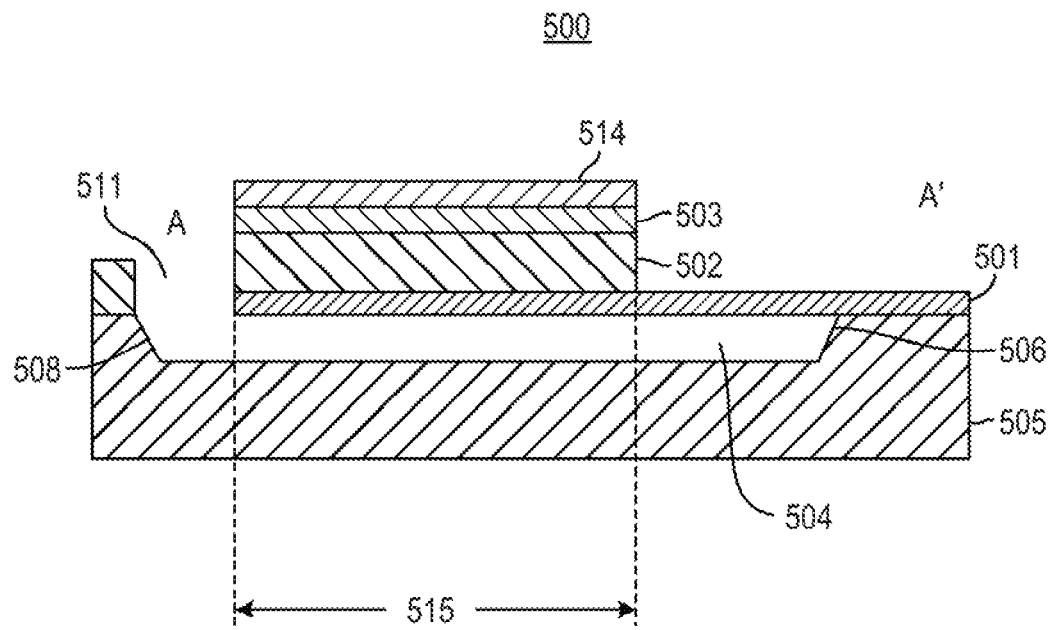
FIG. 5B is a cross-sectional view of the FBAR structure of FIG. 5A taken along the line A-A' of FIG. 5A.

FIG. 5B is a cross-sectional view of the FBAR structure 500 of FIG. 5A taken along the line A-A' of FIG. 5A. The FBAR structure 500 comprises the first electrode 501, the piezoelectric layer 502 and the second electrode 503 disposed over the cavity 504 in the substrate 505. In a representative embodiment, a passivation layer 514 (not shown in FIG. 5A) is disposed over the second electrode 503. The passivation layer 514 can be formed of various types of materials, including aluminum nitride, silicon carbide, BSG, SiO$_2$, SiN, polysilicon, and the like. The thickness of the passivation layer 514 should generally be sufficient to insulate the layers of FBAR structure 500 from the environment, including protection from moisture, corrosives, contaminants, and debris.

As depicted in FIG. 5B, an active area 515 of the FBAR structure 500 consists of the contacting overlap of the first electrode 501, the piezoelectric layer 502, the second electrode 503 and the cavity 504. The active area 515 is substantially suspended over the cavity 504 and is supported by the portion of the first electrode 501 that extends over the side 506 of the cavity 504 and over the substrate 505. However, the first electrode 501 does not extend across side 508 of the cavity 504, and the piezoelectric layer 502 is removed or otherwise not formed in region 511. As such, the active area 515 is supported at side 506 of the cavity 504, and is substantially mechanically isolated from the substrate 505 as a result. Moreover, and in contrast to FBAR structures 100~300 described in connection with representative embodiments above, the piezoelectric layer 502 is removed or otherwise not formed so as to not extend over the side 506 of the cavity 504 or over the substrate 505. Beneficially, by not extending the piezoelectric layer 502 over the side 507 and over the substrate 505, mechanical isolation of the active area 515 from the mechanical stresses/forces on the substrate 505 is further improved.

Figure 5C:
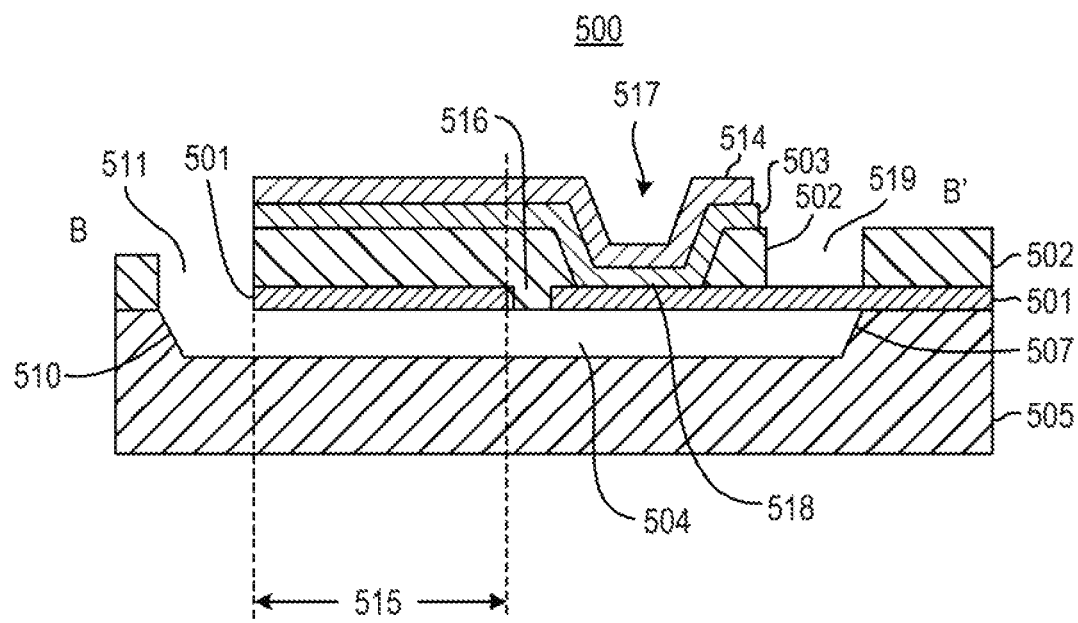
FIG. 5C is a cross-sectional view of the FBAR structure of FIG. 5A taken along the line B-B' of FIG. 5A.

FIG. 5C is a cross-sectional view of the FBAR structure 500 of FIG. 5A taken along the line B-B' of FIG. 5A. The FBAR structure 500 comprises the first electrode 501, the piezoelectric layer 502 and the second electrode 503 disposed over the cavity 504 in the substrate 105. Notably, a section 516 of the first electrode 501 is removed or otherwise not formed, and creates a break in the first electrode 501 along this cross-section for reasons explained below. As depicted in FIG. 5C, the active area 515 of the FBAR structure 500 is substantially suspended over the cavity 504 and is supported by the portion of the first electrode 501 that extends over the side 507 of the cavity 504. However, the first electrode 501 does not extend across side 510 of the cavity 504, and the piezoelectric layer 502 is removed or otherwise not formed in region 511. As such, the active area 515 is supported at side 507 of the cavity 504 by the unconnected portion of first electrode 501, and is substantially mechanically isolated from the substrate 105 as a result.

As depicted in FIG. 5C, a recess 517 is formed at the overlap of the first electrode 501, the second electrode 503 and the passivation layer 514. This recess 517 is formed by removing or otherwise not forming the piezoelectric layer 502 in this portion of the FBAR structure 500. The recess 517 allows the electrical connection at junction 518 to the portion of the first electrode 501 that extends over the side 507 of the cavity 504 and over the substrate 505.

In the presently described representative embodiment, the active area 515 of the FBAR structure 500 is supported through the mechanical connection of the first electrode 501 to the substrate 505 over sides 506 and 507 of the cavity 504, and remains unconnected to the remaining sides 508, 509 and 510 of the cavity.

As depicted in FIG. 5B, the piezoelectric layer 502 is disposed over at least a portion of the first electrode 501. However, the piezoelectric layer 502 is removed or otherwise not formed at a gap 519, extends over the substrate 505, but terminates at side 507. So, for example, in the presently described embodiment, the piezoelectric layer 502 is provided over the first electrode 501 and both the first electrode 501 and the piezoelectric layer 502 extend over the substrate 505, but the piezoelectric layer 502 terminates at side 507. As such, along cross-section B-B' the piezoelectric layer 502 is not continuous due to gap 519. Notably, however, providing piezoelectric layer 502 over the substrate 505 adjacent to but not extending over side 507 provides mechanical robustness to the FBAR structure 100, and beneficially reduces the susceptibility of the FBAR structure 100 to mechanical failure or fatigue, especially over time.

Figure 6A:
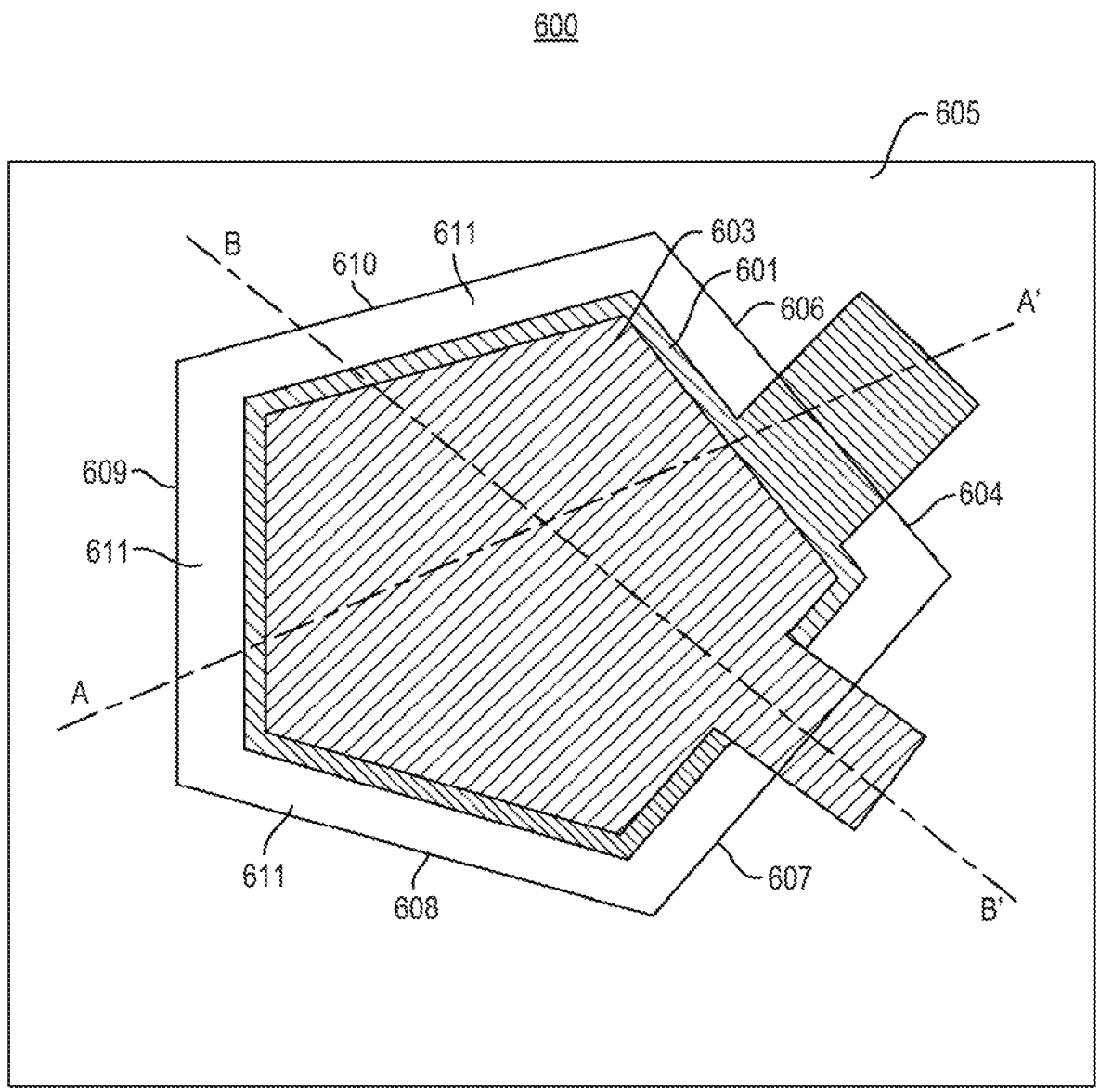
FIG. 6A is top view of an FBAR structure according to a representative embodiment.

FIG. 6A is a top view of an FBAR structure 600 according to a representative embodiment. Many details of the FBAR structure 600 are substantively the same as those provided in the description of FBAR structures 100~500. These details are not always repeated in order to avoid obscuring the description of the description of the presently described representative embodiments.

The FBAR structure 600 comprises a first electrode 601, a piezoelectric layer (not shown in FIG. 5A) and a second electrode 603 stacked over one another. The FBAR structure 600 comprises a cavity 604 formed in a substrate 605. The cavity comprises a plurality of sides 606~610, where generally the number of the plurality of sides 606~610 is the same as the number of sides of the first and second electrodes 601, 603.

In a region 611, the piezoelectric layer 602 is removed or otherwise not formed. As described more fully below, the piezoelectric layer 602 is disposed over at least a portion of the first electrode 601, and extends from beyond at least one edge of the first electrode 601 and over at least one of the plurality of sides 606~610 having the first electrode 601 extending thereover.

As can be seen in FIG. 6A, the second electrode 603 does not overlap the entirety of either the first electrode 601 or the piezoelectric layer 602. Rather, the second electrode 603 overlaps only a portion of the area of the first electrode 601 and the piezoelectric layer 602. Moreover, in the representative embodiment depicted in FIG. 6A, the second electrode 603 of the FBAR structure 600 does not extend over any of the plurality of sides 606~610 of the cavity 604 formed in the substrate 605. As such, the active area of the FBAR structure 600, which is defined as the area of contacting overlap of the second electrode 603, the piezoelectric layer 602, the first electrode 601 and the cavity 604, is suspended over the cavity 604. As described more fully below, by this beneficial arrangement, the active area of the FBAR structure 600 is substantially mechanically isolated from the substrate 605, and therefore, is not susceptible to mechanical stress from the substrate 605. Beneficially, this substantial isolation of the active area of the FBAR structure 600 from mechanical stress of the substrate 605 reduces the drift of the center frequency and bandwidth of the FBAR structure 600.

Figure 6B:
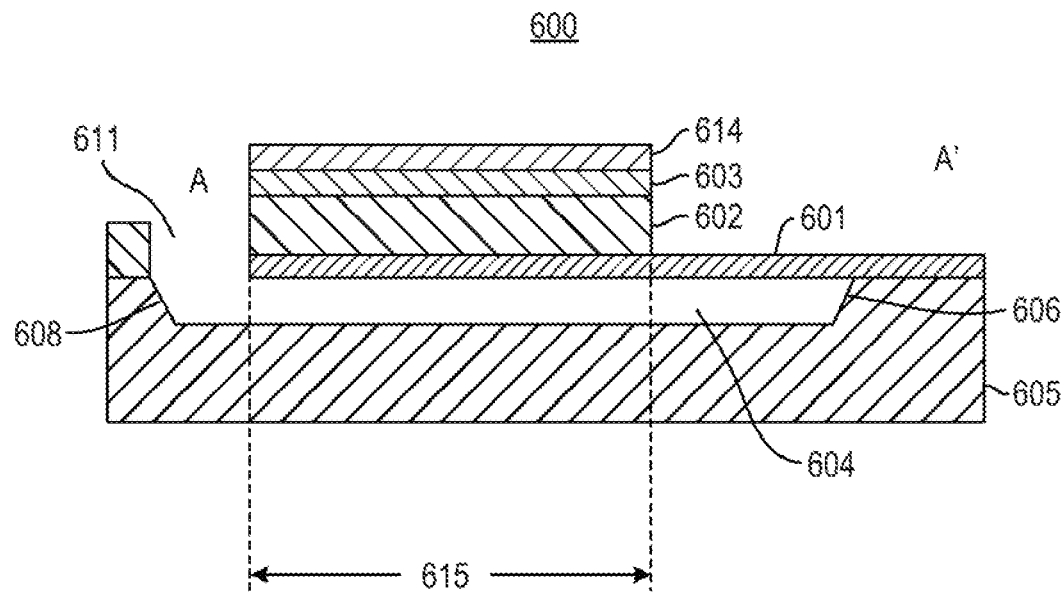
FIG. 6B is a cross-sectional view of the FBAR structure of FIG. 6A taken along the line A-A' of FIG. 6A.

FIG. 6B is a cross-sectional view of the FBAR structure 600 of FIG. 5A taken along the line A-A' of FIG. 6A. The FBAR structure 600 comprises the first electrode 601, the piezoelectric layer 602 and the second electrode 603 disposed over the cavity 604 in the substrate 605. In a representative embodiment, a passivation layer 614 (not shown in FIG. 5A) is disposed over the second electrode 603. The passivation layer 614 can be formed of various types of materials, including aluminum nitride, silicon carbide, BSG, $Si_{O2}$, SiN, polysilicon, and the like. The thickness of the passivation layer 614 should generally be sufficient to insulate the layers of FBAR structure 600 from the environment, including protection from moisture, corrosives, contaminants, and debris.

As depicted in FIG. 6B, an active area 615 of the FBAR structure 500 consists of the contacting overlap of the first electrode 601, the piezoelectric layer 602, the second electrode 603 and the cavity 604. The active area 615 is substantially suspended over the cavity 604 and is supported by the portion of the first electrode 601 that extends over the side 606 of the cavity 604 and over the substrate 605. However, the first electrode 601 does not extend across side 608 of the cavity 604, and the piezoelectric layer 602 is removed or otherwise not formed in region 611. As such, the active area 615 is supported at side 606 of the cavity 604, and is substantially mechanically isolated from the substrate 605 as a result. Moreover, and in contrast to FBAR structures 100~300 described in connection with representative embodiments above, the piezoelectric layer 602 is removed or otherwise not formed so as to not extend over the side 606 of the cavity 604 or over the substrate 605. Beneficially, by not extending the piezoelectric layer 602 over the side 607 and over the substrate 605, mechanical isolation of the active area 615 from the mechanical stresses/forces on the substrate 605 is further improved.

Figure 6C:
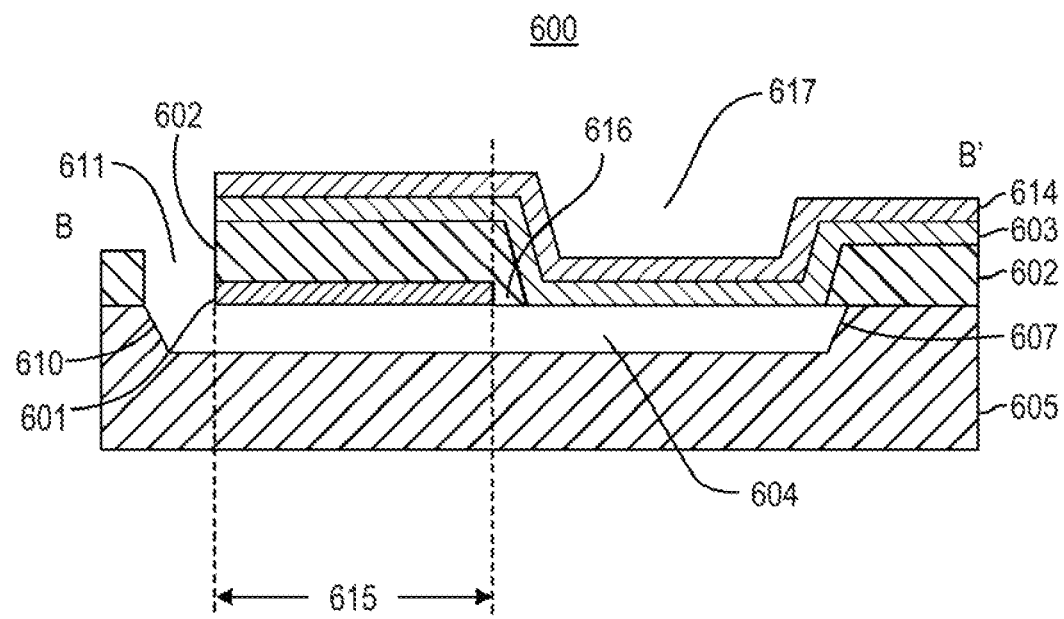
FIG. 6C is a cross-sectional view of the FBAR structure of FIG. 6A taken along the line B-B' of FIG. 6A.

FIG. 6C is a cross-sectional view of the FBAR structure 600 of FIG. 6A taken along the line B-B' of FIG. 6A. The FBAR structure 600 comprises the first electrode 601, the piezoelectric layer 602 and the second electrode 603 disposed over the cavity 604 in the substrate 605. Notably, the first electrode 601 is terminated over the cavity 604 as shown, leaving a section 616 between the first electrode 601 and the second electrode 603 for reasons explained below. As depicted in FIG. 6C, the active area 615 of the FBAR structure 600 is substantially suspended over the cavity 604 and is supported by the portion of the first electrode 601 that extends over the side 607 of the cavity 604. However, the first electrode 601 does not extend across side 610 of the cavity 604.

As depicted in FIG. 6C, a recess 617 is formed at the overlap of the first electrode 601, the second electrode 603 and the passivation layer 614. This recess 617 is formed by removing or otherwise not forming the piezoelectric layer 602 in this portion of the FBAR structure 500. Through the arrangement of the second electrode 603 at the recess 617 the second electrode 603 extends over a portion of the piezoelectric layer 602 that extends over the side 607 of the cavity 604 and over the substrate 605 as shown. By this arrangement, the active area 615 of the FBAR structure 600 is supported through the mechanical connection of the second electrode 603 to the substrate 605 over side 607 of the cavity 604.

In the presently described representative embodiment, the active area 615 of the FBAR structure 600 is supported through the mechanical connection of the first electrode 601 to the substrate 605 over side 606 and through the mechanical connection of the second electrode 603 to the portion of the piezoelectric layer 602 that extends over side 607 of the cavity 604. Moreover, neither the first electrode 601 nor the second electrode 603 are formed over remaining sides 608, 609 and 610 of the cavity 604.

As depicted in FIG. 6B, the piezoelectric layer 602 is disposed over at least a portion of the first electrode 601. However, the piezoelectric layer 602 is removed or otherwise not formed in the recess 617, but extends over the side 607 and the substrate 605. So, along cross-section B-B' for example, in the presently described embodiment, the piezoelectric layer 602 is provided over the first electrode 601 and both the second electrode 603 and the piezoelectric layer 602 extend over the substrate 605 at side 607. As such, along cross-section B-B' the piezoelectric layer 602 is not continuous due to recess 617. Notably, however, providing piezoelectric layer 602 over the substrate 605 adjacent to and extending over side 607 provides mechanical robustness to the FBAR structure 600. Moreover, an improvement in stress relief is realized because the active area 615 of the FBAR structure is suspended by comparatively fewer layers thereby leading to better mechanical isolation from substrate stress passed through the other layers.

Figure 7A:
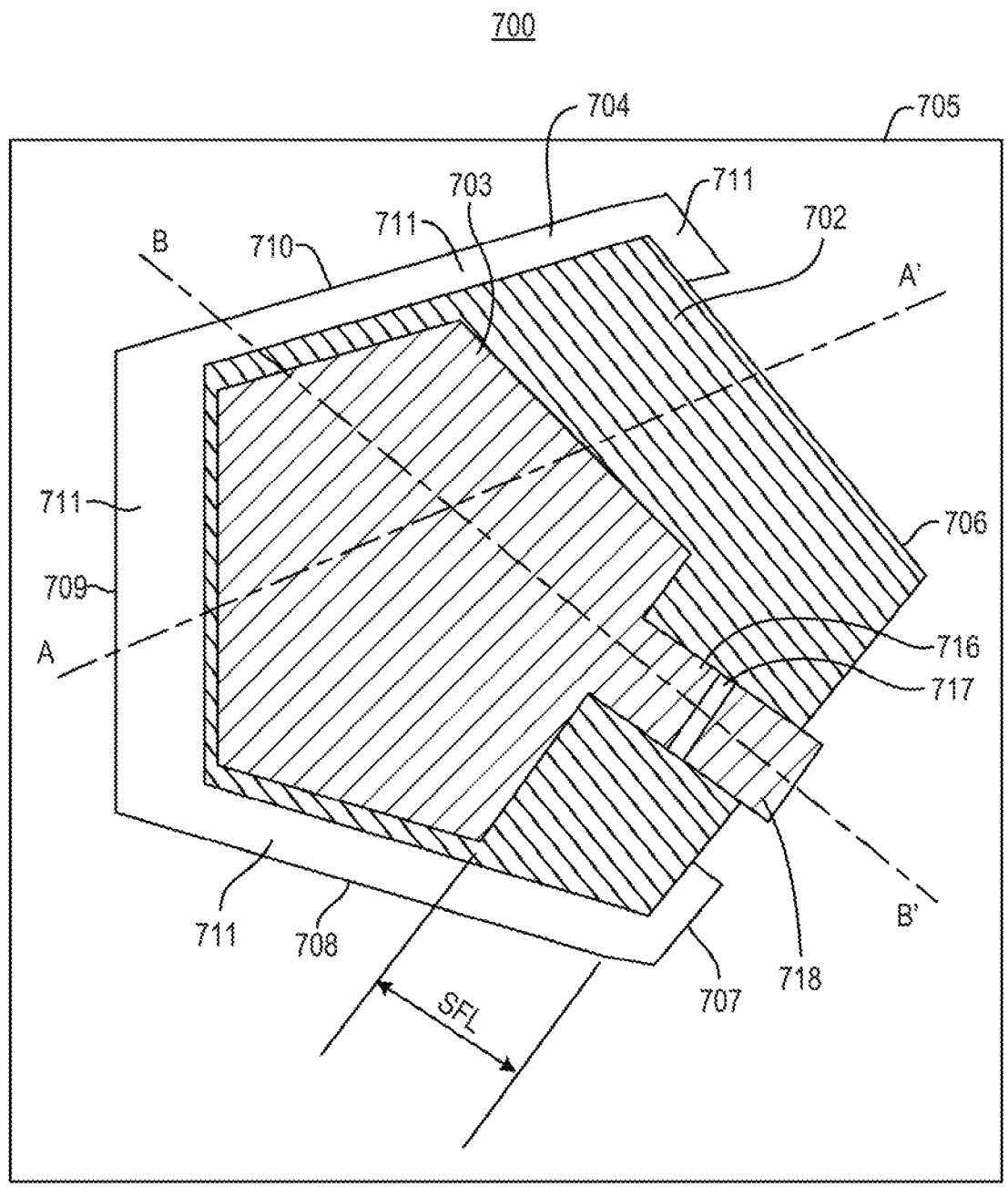
FIG. 7A is a top view of an FBAR structure according to a representative embodiment.

FIG. 7A is top view of an FBAR structure 700 according to a representative embodiment. Many details of the FBAR structure 700 are substantively the same as those provided in the description of FBAR structures 100~600. These details are not always repeated in order to avoid obscuring the description of the presently described representative embodiments.

The FBAR structure 700 comprises a first electrode 701, a piezoelectric layer 702 and a second electrode 703 stacked over one another. It is noted that for convenience of explanation, the piezoelectric layer 702 is depicted in FIG. 7A as being transparent so that certain features of the first electrode 701 can be described. The piezoelectric layer 702 is not transparent. Moreover, an optional passivation layer, which is described below, may be provided over the uppermost layers of the FBAR structure 700, and is not shown in FIG. 7A to better present the description of the arrangement of the layers of the FBAR structure 700.

The FBAR structure 700 comprises a cavity 704 formed in a substrate 705. The cavity comprises a plurality of sides 706~710, where generally the number of the plurality of sides 706~710 is the same as the number of sides of the first and second electrodes 701, 703.

In a region 711, the piezoelectric layer 702 is removed or otherwise not formed. As described more fully below, piezoelectric layer 702 is disposed over at least a portion of the first electrode 701, and extends from beyond at least one edge of the first electrode 701 and over at least one of the plurality of sides 706~710 having the first electrode 701 extending thereover.

As can be seen in FIG. 7A, the second electrode 703 does not overlap the entirety of either the first electrode 701 or the piezoelectric layer 702. Rather, the second electrode 703 overlaps only a portion of the area of the first electrode 701 and the piezoelectric layer 702. Moreover, in the representative embodiment depicted in FIG. 7A, the second electrode 703 of the FBAR structure 700 does not extend over any of the plurality of sides 706~710 of the cavity 704 formed in the substrate 705. As such, the active area of the FBAR structure 700, which is defined as the area of contacting overlap of the second electrode 703, the piezoelectric layer 702, the first electrode 701 and the cavity 704, is suspended over the cavity 704. By this arrangement, the active area of the FBAR structure 700 is substantially mechanically isolated from the substrate 705, and therefore, is not susceptible to significant mechanical stress from the substrate 705. Beneficially, this substantial isolation of the active area of the FBAR structure 700 from mechanical stress of the substrate 705 reduces the drift of the resonant frequency of the FBAR structure 700.

Figure 7B:
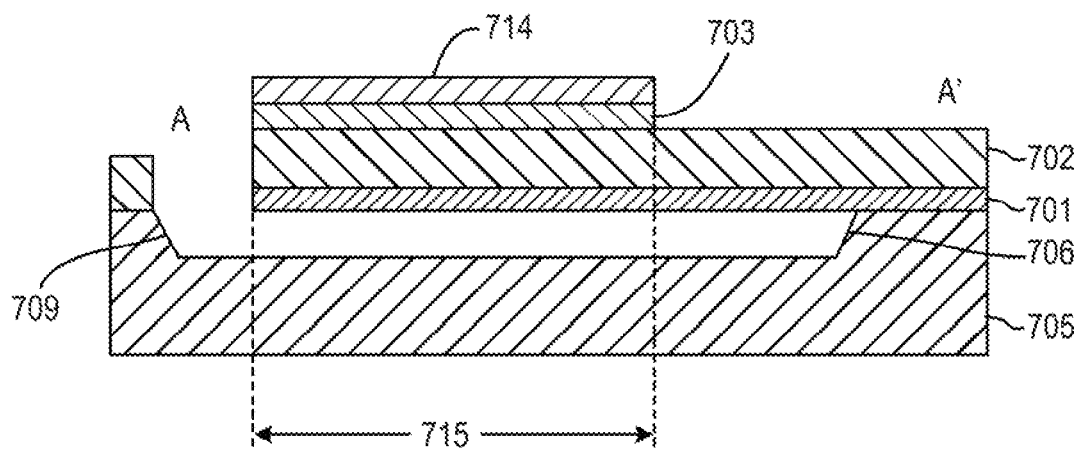
FIG. 7B is a cross-sectional view of the FBAR structure of FIG. 7A taken along the line A-A' of FIG. 7A.

FIG. 7B is a cross-sectional view of the FBAR structure 700 of FIG. 7A taken along the line A-A' of FIG. 7A. The FBAR structure 700 comprises the first electrode 701, the piezoelectric layer 702 and the second electrode 703 disposed over the cavity 704 in the substrate 705. In a representative embodiment, a passivation layer 714 (not shown in FIG. 7A) is disposed over the second electrode 703. The passivation layer 714 can be formed of various types of materials, including aluminum nitride, silicon carbide, BSG, SiO$_2$, SiN, polysilicon, and the like. The thickness of the passivation layer 714 should generally be sufficient to insulate the layers of FBAR structure 100 from the environment, including protection from moisture, corrosives, contaminants, and debris.

As depicted in FIG. 7B, an active area 715 of the FBAR structure 700 consists of the contacting overlap of the first electrode 701, the piezoelectric layer 702, the second electrode 703 and the cavity 704. The active area 715 is substantially suspended over the cavity 704 and is supported by the portion of the first electrode 701 and the piezoelectric layer 702 that extend over the side 706 of the cavity 704. However, the first electrode 701 does not extend across side 709 of the cavity 704, and the piezoelectric layer 702 is removed or otherwise not formed in region 711. As such, the active area 715 is supported at side 106 of the cavity 704, and is substantially mechanically isolated from the substrate 105 as a result.

Figure 7C:
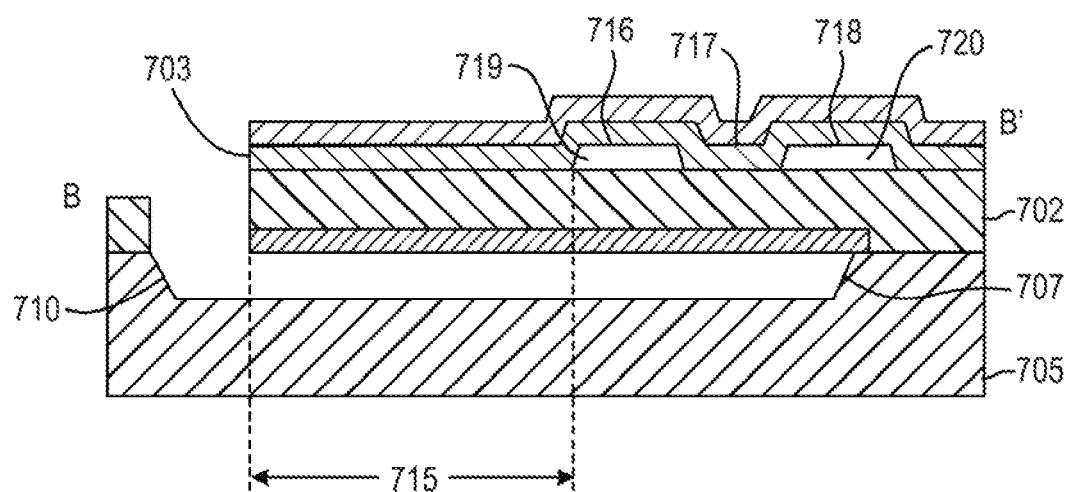
FIG. 7C is a cross-sectional view of the FBAR structure of FIG. 7A taken along the line B-B' of FIG. 7A.

FIG. 7C is a cross-sectional view of the FBAR structure 700 of FIG. 7A taken along the line B-B' of FIG. 7A. The FBAR structure 700 comprises the first electrode 701, the piezoelectric layer 702 and the second electrode 703 disposed over the cavity 704 in the substrate 705. In the suspended active area structure of FBAR structure 700, an electrical connection is made to the second electrode 703 via a first bridge 716 and a second bridge 718 that is separated from the first bridge 716 by a recess 717. As shown, the first bridge 716 and the second bridge 718 extend over the piezoelectric layer 702 and the first electrode 701. The first bridge 716 is physically separated from the piezoelectric layer 702 by a first space 719, and the second bridge 718 is physically separated from the piezoelectric layer 702 by a second space 720. Notably, the first space 719 terminates the contacting overlap of the first electrode 701, the piezoelectric layer 702 and the second electrode 703, and as such terminates the active area 715 of the FBAR structure 700. Illustratively, the first and second bridges 716, 718 are formed according to the teachings of the above-referenced, commonly owned U.S. Pat. No. 8,248,825 to Choy, et al. As depicted in FIG. 7B, the first and second spaces 719, 720, are empty, comprising only air. In other representative embodiments, the first and second spaces 719, 710 are filled with a non-conductive dielectric material (not shown in FIG. 7C) that improves the mechanical strength of the bridge and provides thermal resistance to the substrate 705, which generally comprises silicon.

As depicted in FIG. 7A, the signal feed line (SFL) length is comparatively larger, and effects improved isolation of the active area 715 from the substrate 705. Notably, the implementation of the "double-bridge" arrangement with first bridge 716, recess 717 and second bridge 718 is done, at least in part, to increase the SFL. As noted above, the greater the SFL length, the more remote the active area of the FBAR structure 100 is from the substrate 105 and the influence of stress induced on the substrate 105. As such, the length of the bridge 112 is made larger compared to known bridges and signal feeds between external contacts to the FBAR structure. Illustratively, the SFL length is at least 25 μm, and typically can be approximately 10 μm to approximately 100 μm or more. Other structures, such as a double-bridge arrangement described below, can be implemented to provide a suitable SFL length and thus, suitable isolation of the active area of the FBAR structures of representative embodiments.

In a representative embodiment, a passivation layer 714 (not shown in FIG. 4A) is disposed over the second electrode 703. The passivation layer 714 can be formed of various types of materials, including aluminum nitride, silicon carbide, BSG, SiO$_2$, SiN, polysilicon, and the like. The thickness of the passivation layer 714 should generally be sufficient to insulate the layers of FBAR structure 700 from the environment, including protection from moisture, corrosives, contaminants, and debris.

As depicted in FIGS. 7B and 7C, the active area 715 of the FBAR structure 700 is substantially suspended over the cavity 704. Notably, both the first electrode 701 and the piezoelectric layer 702 extend over the sides 707 and 709. The extension of the piezoelectric layer 702 over sides 707, 709 provides mechanical robustness to the FBAR structure 700, and beneficially reduces the susceptibility of the FBAR structure 700 to mechanical failure or fatigue, especially over time. However, the first electrode 701 does not extend over the substrate at sides 708 or 710 of the cavity 704, and the piezoelectric layer 702 is removed or otherwise not formed in region 711. As such, the active area 715 is supported by the first electrode 701 only at two sides 706, 707 of the cavity 704, and is substantially mechanically isolated from the substrate 705 as a result.

In the presently described representative embodiment, the active area 715 of the FBAR structure 700 is supported through the mechanical connection of the first electrode 701 to the substrate 705 over sides 706, 707 of the cavity 704, and remains unconnected to the remaining sides 708, 709 and 710 of the cavity 704. As such, in the presently described representative embodiment, the active area 715 is supported through the mechanical connection of the first electrode 701 to the substrate 705 on only two of the plurality of sides 706~710. As should be appreciated by one of ordinary skill in the art, the fewer the number of sides of the first electrode 701 connected to the substrate 705, the better the mechanical isolation of the active area 715 from the substrate 705. As such, in representative embodiments, the first electrode 701 is mechanically connected to the substrate 705 through extension of the first electrode 701 over at least one of the plurality of sides 706~410 of the substrate 705, but connections to substrate 705 by the extension of first electrode 701 over more than two of the plurality of sides 706~710 are generally avoided.

Figure 8A:
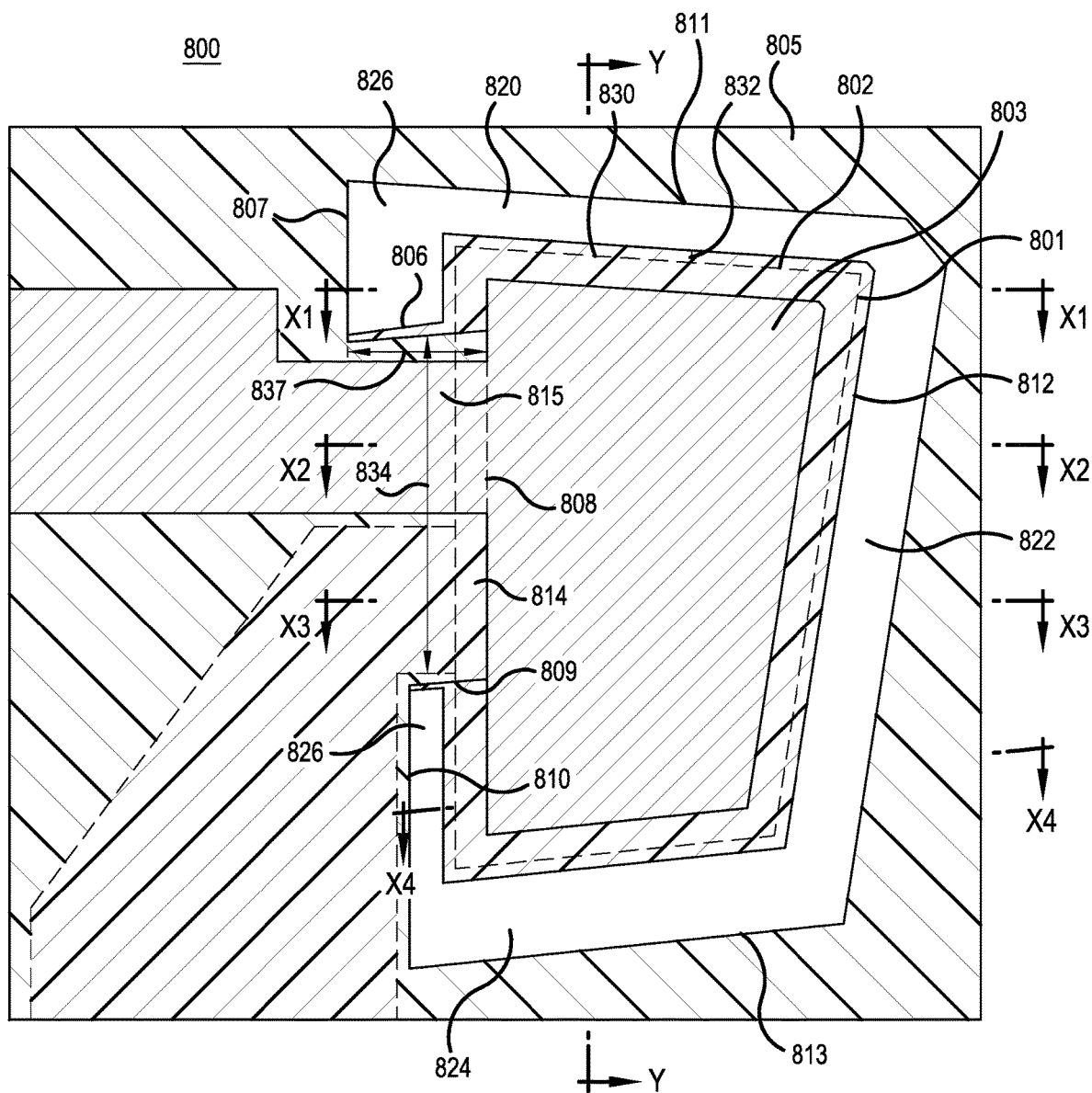
FIG. 8A is a top view of an FBAR structure according to a representative embodiment.

FIG. 8A is a top view of an FBAR structure 800 according to a representative embodiment. Many details of the FBAR structure 800 are substantively the same as those provided in the description of FBAR structures 100~700. These details are not always repeated in order to avoid obscuring the description of the presently described representative embodiments. Moreover, certain components used to provide improvements in performance of the FBAR structure 800 are not generally described. For example, a passivation layer such as described above, mass loading elements and recesses (so-called "outies" and "innies"), temperature compensation (so-called "tempco") structures, and cantilevers (so-called "wings"), can be provided in selected locations of FBAR structure.

The FBAR structure 800 comprises a first electrode 801 (shown by dashed line), a piezoelectric layer 802 and a second electrode 803 stacked over one another. An optional passivation layer, which is described above, may be provided under the piezoelectric layer 802, or over the piezoelectric layer 802 of the FBAR structure 800, and is not shown in FIG. 8A to better present the description of the arrangement of the layers of the FBAR structure 800.

The FBAR structure 800 comprises a cavity 804 formed in a substrate 805. The cavity 104 comprises a plurality of sides 806~813. A contacting overlap of the first electrode 801, the piezoelectric layer 802, and the second electrode 803, suspended over cavity 804, provides an active area of the FBAR structure 800.

The first electrode 801 comprises a first connection portion 814, and the second electrode 803 comprises a second connection portion 815. The first connection portion 814 connects to the first electrode 801 over only side 808 (i.e., on only one side of the plurality of sides 806~813 of the cavity 804); and the second connection portion 815 connects to the second electrode 803 over only side 808 of the plurality of sides (i.e., on only one side of the plurality of sides 806~813 of the cavity 804).

In a representative embodiment, the substrate 805 comprises silicon (Si) or similar material. Generally, the cavity 804 comprises air, and is formed by a known method. The first electrode 801 and the second electrode 803 are comprised of a suitable electrically conductive material such as tungsten (W) or molybdenum (Mo). The piezoelectric layer 802 can comprise, for example, aluminum nitride (AlN), rare-earth (e.g., Scandium doped) AlN, zinc oxide (ZnO), or lead zirconium titanate (PZT). Generally, the piezoelectric layer 802 comprises a highly-textured c-axis piezoelectric material where the c-axis orientations of the crystals of the piezoelectric material are well-collimated, and as such are parallel with one another and perpendicular to the plane of the electrodes (e.g., first and second electrodes 801, 803).

Many of the details of the materials contemplated for use as the substrate 805, first electrode 801, piezoelectric layer 802 and second electrode 803, thicknesses of these materials, and details of the methods of manufacture of the FBAR structure 800 are known and are tailored to a particular application. Many of these details are described, for example, in one or more of the patents, patent application publications and patent applications incorporated by reference above. Often, these details are not repeated in order to avoid obscuring the description of the present teachings.

Notably, the second connection portion 815 is adjacent to first connection portion 814, and thus the first and second connection portions 814, 815 do not overlap. As will become clearer as the present description continues, by locating the first and second connection portions 814, 815 on only one side (side 808) of the cavity 804, and disposing the first and second connection portions 814, 815 in tandem, and not overlapping, parasitic capacitance, and a parasitic resonator are not created.

As depicted in FIG. 8A, the first and second connection portions 814, 815 are disposed in a recess comprised of sides 806, 808 and 809. Notably, a width 837 of the recess comprised of sides 806, 808 and 809 is in the range of approximately 1.0 μm to approximately 20.0 μm.

Side 808 has a length 834 that is substantially smaller than sides 811, 812, and 813. Notably, in certain representative embodiments, the length 834 of side 808 is in a range of approximately 30% to approximately 80% of lengths of sides 811, 812, and 813. As such, the first and second connection portions 814, 815 have a comparatively smaller width. As will become clearer as the present description continues, the spaces 820, 822, 824, and 826 are provided by the cavity 804, and between the plurality of sides 806~813 of the cavity 804, and the sides of the first electrode 801, the piezoelectric layer 802, and the second electrode 803 result in the FBAR resonator's being disposed over the cavity 804 with connection made to only one side 808 of the cavity 804.

Since the only physical contact and connection of the active area of the FBAR resonator to the substrate 805 is made at side 808 with first and second connection portions 814, 815, strain induced to the active area of the FBAR is substantially less than FBAR structures that make connections to more than one side of a cavity. By providing connections to one side (808) that is small compared to other sides (811~813), further improvements to stress relief are realized. To this end, making the connection to the active area of the FBAR at only one side (808) renders strain in the x-dimension of the coordinate system of FIG. 8A substantially nil since there is not a connection to side 812. Furthermore, strain induced in the y-dimension is comparatively small. The narrow width (y-dimension) of the side 808, and first and second connection portions 814, 815 (again y-dimension) also enables a reduction in strain induced in the y-dimension since the contact areas of the first and second connection portions 814, 815 are comparatively small. Such improvements in induced strain render improvements to variations in the resonance frequency, and overall frequency response of the FBAR resonator structure 800.

As described more fully below, the piezoelectric layer 802 may extend beyond an edge 830 of the second electrode 803 by a distance 832. In accordance with representative embodiments, the distance 832 is in a range of approximately 1.0 μm to approximately 10.0 μm. Alternatively, the second electrode 803 may extend beyond an edge of piezoelectric layer 802 by a distance of approximately 0.5 μm to approximately 10.0 μm. As described more fully in connection with FIG. 8B, the portion of the piezoelectric layer 802 that extends beyond the edge 830 is formed by etching the piezoelectric layer 802 from over the substrate 805 and the sacrificial layer (not shown) disposed over the cavity 804 during fabrication. This provides separation of the active area of the FBAR and the plurality of sides 806~813 of the cavity 804.

Figure 8B:
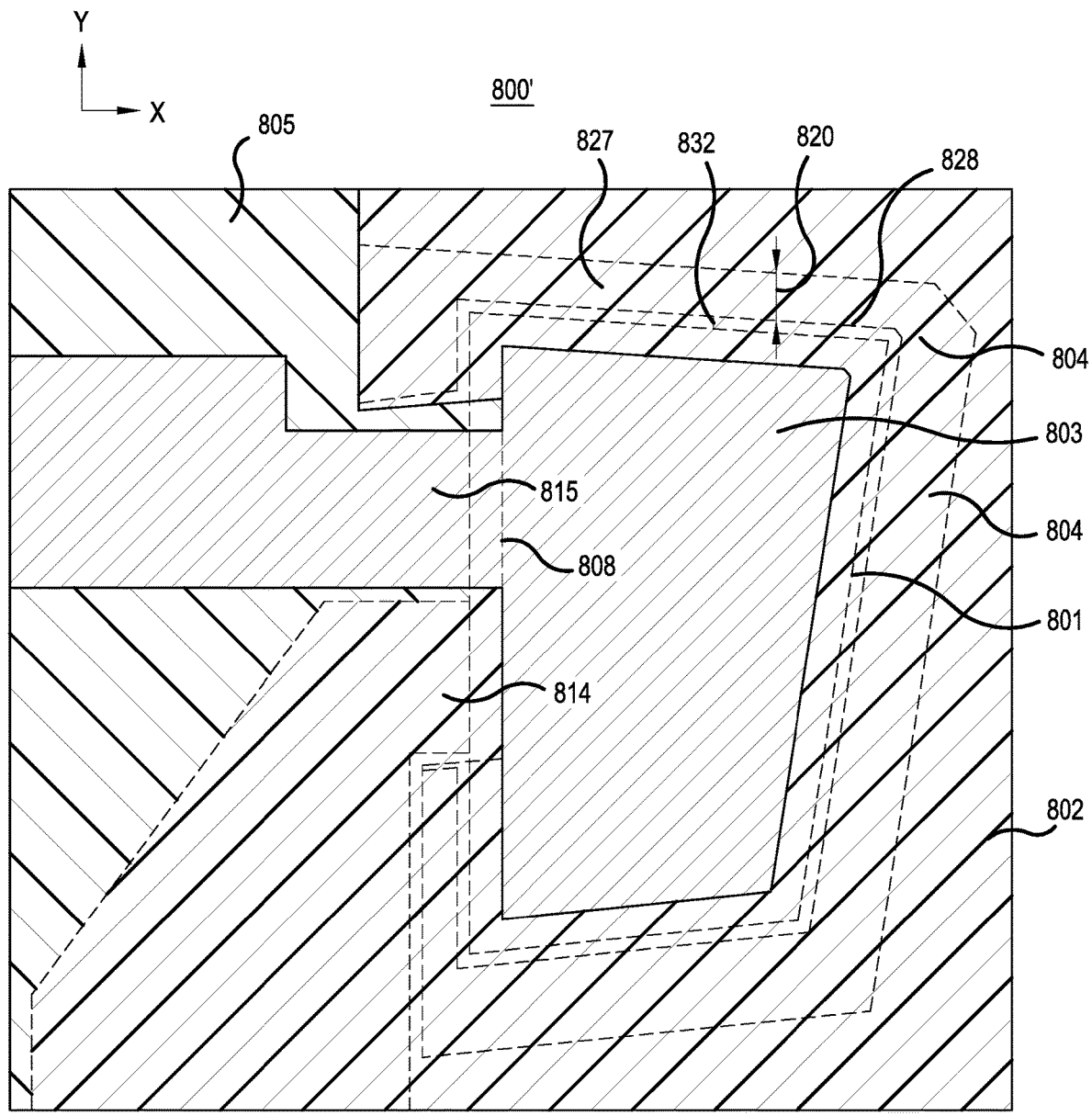
FIG. 8B is a top view of an FBAR structure according to a representative embodiment.

FIG. 8B shows a top view of FBAR structure 800' at a fabrication step nearing the end of fabrication. Many details of the FBAR structure 800' are substantively the same as those provided in the description of FBAR structures 100~800. These details are not always repeated in order to avoid obscuring the description of the presently described representative embodiments.

In FIG. 8B, the piezoelectric layer 802 has been formed over a sacrificial layer (not shown) over cavity 804 during the fabrication sequence. Using a known pattern and etch method, the piezoelectric layer 802 is removed to a perimeter 827, and thus extends past an edge of the first electrode 801 by the distance 832. After this fabrication step, the sacrificial layer (not shown) is removed, revealing FBAR structure 800 depicted in FIG. 8A.

Figure 8C:
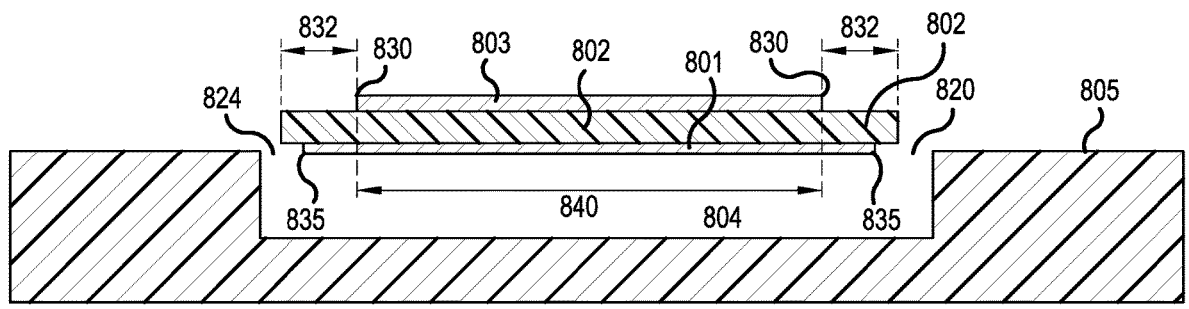
FIG. 8C is a cross-sectional view of the FBAR structure of FIG. 8A taken along the line Y-Y of FIG. 8A.

FIG. 8C is a cross-sectional view of the FBAR structure 800 of FIG. 8A taken along the line Y-Y of FIG. 8A. Many details of the FBAR structure 800 are substantively the same as those provided in the description of FIGS. 8A, 8B. As shown, an active area 840 is an area of contacting overlap of the first electrode 801, the piezoelectric layer 802, and the second electrode 803, suspended over the cavity 804. Moreover, spaces 824 and 820 show the separation of the acoustic stack with two of the plurality of sides 806~813, which are not contacted by the acoustic stack of the FBAR structure 800.

As described previously, in a representative embodiment, the piezoelectric layer 802 extends beyond edge 830 of the second electrode 803 by a distance 832. Moreover, as depicted in FIG. 8C, the piezoelectric layer 802 extends beyond edge 835 of the first electrode 801. By providing the piezoelectric layer 802 beyond the edges 830, 835 of the first and second electrodes 801, 803, respectively, deleterious depositions, which can occur during ion milling used in tuning of the FBAR structure 800, can be avoided. Specifically, during the ion milling sequence, re-deposition of materials used in the fabrication of the FBAR structure 800 can occur along the perimeter of the acoustic stack of the FBAR structure 800. Such re-deposition in the active area 840 can adversely impact the performance of the FBAR structure 800. By providing the perimeter (i.e., the perimeter of the piezoelectric layer 802) of the acoustic stack of the FBAR structure 800 that is separated from the active area 840, any re-deposited material does not accumulate in the active area 840, and therefore, does not significantly impact the performance of the FBAR structure 800. Further optimization occurs when the non-active perimeter of the active resonator is increased, while simultaneously narrowing the space 820 to minimize re-deposition of material along an under-side (i.e., the side over the cavity 804) of the FBAR structure 800.

As noted above, the extension of the piezoelectric layer 802 by distance 832 is but one way to avoid re-deposition of materials in the active area 840 during ion milling. Alternatively, the second electrode 803 can be extended in a similar way beyond the outer edge of the piezoelectric layer 802.

Figure 8D:
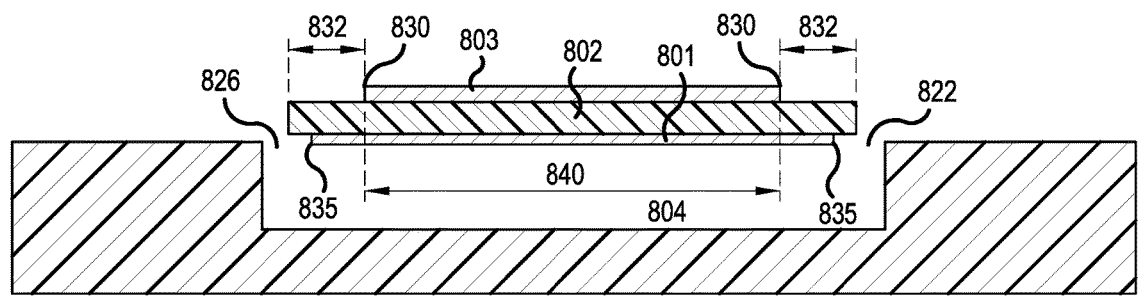
FIG. 8D is a cross-sectional view of the FBAR structure of FIG. 8A taken along the line X1-X1 of FIG. 8A.

FIG. 8D is a cross-sectional view of the FBAR structure of FIG. 8A taken along the line X1-X1 of FIG. 8A. Many details of the FBAR structure 800 are substantively the same as those provided in the description of FIGS. 8A, 8B. As shown, the active area 840 is an area of contacting overlap of the first electrode 801, the piezoelectric layer 802, and the second electrode 803, suspended over the cavity 804. Moreover, spaces 822 and 826 depict the separation of the acoustic stack from two of the plurality of sides 806~813, which are not contacted by the acoustic stack of the FBAR structure 800.

As described previously, in a representative embodiment, the piezoelectric layer 802 extends beyond edge 830 of the second electrode 803 by a distance 832. Moreover, as depicted in FIG. 8D, the piezoelectric layer 802 extends beyond edge 835 of the first electrode 801. As described above, by providing the piezoelectric layer 802 beyond the edges 830, 835 of the first and second electrodes 801, 803, respectively, deleterious depositions, which can occur during ion milling used in tuning of the FBAR structure 800, can be avoided.

As noted above, the extension of the piezoelectric layer 802 by distance 832 is but one way to avoid re-deposition of materials in the active area during ion milling. Alternatively, the second electrode 803 can be extended in a similar way beyond the outer edge of the piezoelectric layer 802.

Figure 8E:
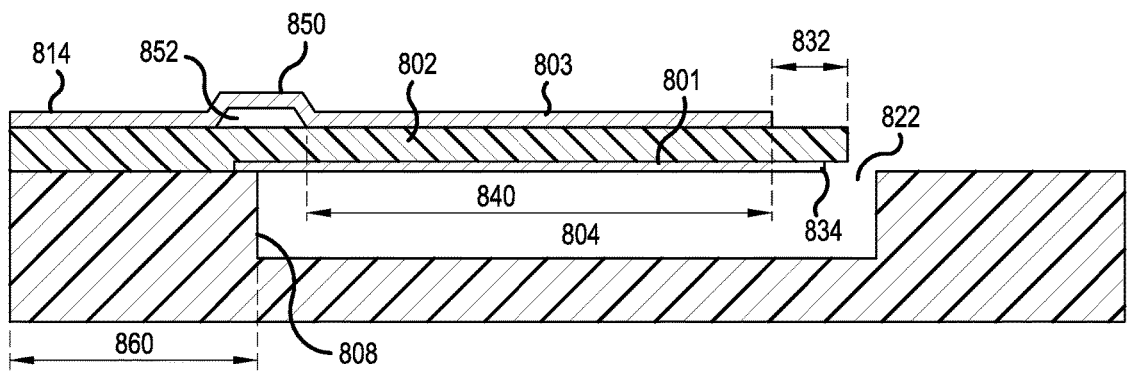
FIG. 8E is a cross-sectional view of the FBAR structure of FIG. 8A taken along the line X2-X2 of FIG. 8A.

FIG. 8E is a cross-sectional view of the FBAR structure of FIG. 8A taken along the line X2-X2 of FIG. 8A. Many details of the FBAR structure 800 are substantively the same as those provided in the description of FIGS. 8A, 8B, 8C and 8D. As shown, the active area 840 is an area of contacting overlap of the first electrode 801, the piezoelectric layer 802, and the second electrode 803, disposed over the cavity 804. Moreover, space 822 shows the separation of the acoustic stack with one the plurality of sides 806~813, which is not contacted by the acoustic stack of the FBAR structure 800. However, on the opposing side, the first connection portion 814 is connected to the second electrode 803 at side 808 of cavity 804.

As described previously, in a representative embodiment, the piezoelectric layer 802 extends beyond edge 830 of the second electrode 803 by a distance 832. Moreover, as depicted in FIG. 8C, the piezoelectric layer 802 extends beyond edge 835 of the first electrode 801. As described above, by providing the piezoelectric layer 802 beyond the edges 830, 835 of the first and second electrodes 801, 803, respectively, deleterious depositions, which can occur during ion milling used in tuning of the FBAR structure 800, can be avoided.

In the suspended active area of FBAR structure 800, an electrical connection is made to the second electrode 803 by the second connection portion 815 via a bridge 850 comprising a gap 852. The bridge 850 extends over the piezoelectric layer 802. Illustratively, the bridge 850 is formed according to the teachings of the above-referenced, commonly owned U.S. Pat. No. 8,248,825 to Choy, et al. However, like many bridges used to effect the electrical connection to the active area of an FBAR structure, in region 860 there is no first electrode disposed beneath the second connection portion 815, and the piezoelectric layer 802. As mentioned above, by providing the first connection portion 814 adjacent to, and not overlapping the first connection portion 814, region 860 does not include a lower metal portion (e.g., second connection portion 815), and therefore does not include a parasitic capacitor, or a parasitic acoustic resonator. The attendant drawbacks of parasitic capacitance and parasitic resonance are beneficially avoided.

Figure 8F:
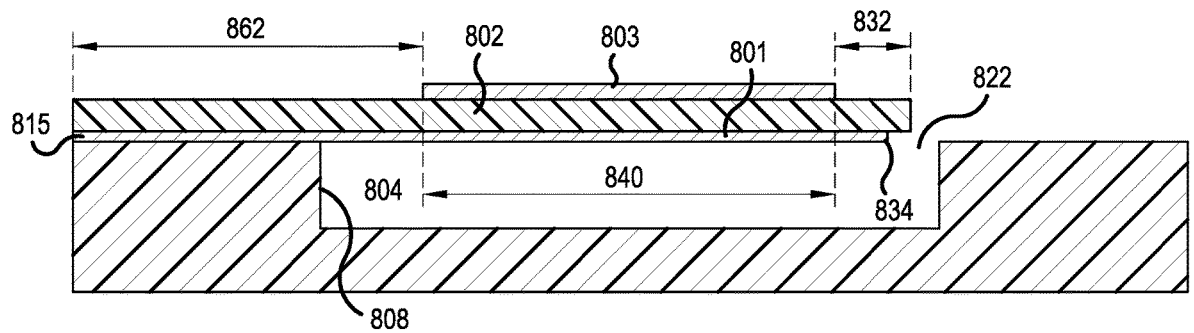
FIG. 8F is a cross-sectional view of the FBAR structure of FIG. 8A taken along the line X3-X3 of FIG. 8A.

FIG. 8F is a cross-sectional view of the FBAR structure of FIG. 8A taken along the line X3-X3 of FIG. 8A. Many details of the FBAR structure 800 are substantively the same as those provided in the description of FIGS. 8A, 8B, 8C, 8D and 8E. As shown, the active area 840 is an area of contacting overlap of the first electrode 801, the piezoelectric layer 802, and the first electrode 801, disposed over the cavity 804. Moreover, space 822 shows the separation of the acoustic stack with one of the plurality of sides 806~813, which is not contacted by the acoustic stack of the FBAR structure 800. However, on the opposing side, the second connection portion 815 is connected to the first electrode 801 at side 808 of cavity 804.

As described previously, in a representative embodiment, the piezoelectric layer 802 extends beyond edge 830 of the second electrode 803 by a distance 832. Moreover, as depicted in FIG. 8F, the piezoelectric layer 802 extends beyond edge 835 of the first electrode 801. By providing the piezoelectric layer 802 beyond the edges 830, 835 of the first and second electrodes 801, 803, respectively, deleterious depositions, which can occur during ion milling used in tuning of the FBAR structure 800, can be avoided.

Furthermore, in region 862 there is no electrode or connection portion (e.g., metal or metal alloy) disposed above the second connection portion 815, and the piezoelectric layer 802. As mentioned above, by providing the second connection portion 815 adjacent to, and not overlapping the first connection portion 814, region 862 does not include a lower metal portion (e.g., second connection portion 815), and therefore does not include a parasitic capacitor, or a parasitic acoustic resonator. The attendant drawbacks of parasitic capacitance and parasitic resonance are beneficially avoided.

Figure 8G:
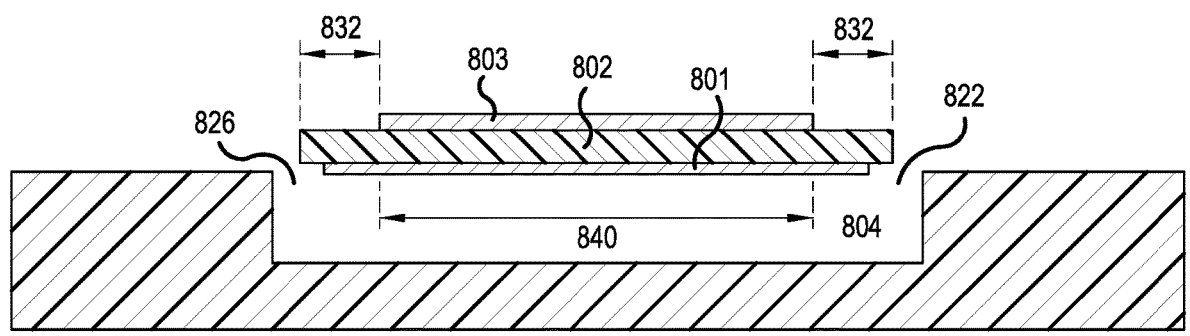
FIG. 8G is a cross-sectional view of the FBAR structure of FIG. 8A taken along the line X4-X4 of FIG. 8A.

FIG. 8G is a cross-sectional view of the FBAR structure of FIG. 8A taken along the line X4-X4 of FIG. 8A. Many details of the FBAR structure 800 are substantively the same as those provided in the description of FIGS. 8A, 8B, 8C, 8D, 8E and 8F. As shown, an active area 840 is an area of contacting overlap of the first electrode 801, the piezoelectric layer 802, and the second electrode 803, suspended over the cavity 804. Moreover, spaces 822 and 826 show the separation of the acoustic stack with two of the plurality of sides 806~813, which are not contacted by the acoustic stack of the FBAR structure 800.

As described previously, in a representative embodiment, the piezoelectric layer 802 extends beyond edge 830 of the second electrode 803 by a distance 832. Moreover, as depicted in FIG. 8G, the piezoelectric layer 802 extends beyond edge 835 of the first electrode 801. As described above, by providing the piezoelectric layer 802 beyond the edges 830, 835 of the first and second electrodes 801, 803, respectively, deleterious depositions, which can occur during ion milling used in tuning of the FBAR structure 800, can be avoided.

As noted above, the extension of the piezoelectric layer 802 by distance 832 is but one way to avoid re-deposition of materials in the active area during ion milling. Alternatively, the second electrode 803 can be extended in a similar way beyond the outer edge of the piezoelectric layer 802.

While representative embodiments are disclosed herein, one of ordinary skill in the art will appreciate that many variations that are in accordance with the present teachings are possible and remain within the scope of the appended claims. The invention therefore is not to be restricted except within the scope of the appended claims.

The invention claimed is:

1. A film bulk acoustic resonator (FBAR) structure comprising:
 a substrate comprising a cavity having a plurality of sides and a bottom surface, wherein the bottom surface comprises a first portion and a second portion;
 a first electrode disposed over the cavity;
 a first connection portion that connects to the first electrode over only one side of the plurality of sides of the cavity;
 a piezoelectric layer disposed over at least a portion of the first electrode;
 a second electrode disposed over the piezoelectric layer; and
 a second connection portion that connects to the second electrode over only the one side of the plurality of sides that is the same side over which the first connection portion connects to the first electrode, the second connection portion not overlapping the first connection portion, wherein a contacting overlap of the first electrode, the piezoelectric layer and the second electrode provides an active area of the FBAR;
 wherein at least a portion of the first electrode, the piezoelectric layer, and the second electrode are suspended over the first portion of the bottom surface and at least one of the first electrode, the piezoelectric layer, or the second electrode extend up to the second portion of the bottom surface from the one side of the plurality of sides exposing the second portion of the bottom surface.

2. The FBAR structure of claim 1, wherein the piezoelectric layer does not exist between the first and second connection portions.

3. The FBAR structure of claim 1, wherein the active area is suspended over the cavity and does not extend over any of the sides.

4. The FBAR structure of claim 1, wherein the first electrode comprises a plurality of edges, and the piezoelectric layer extends past each of the plurality of edges of the first electrode.

5. The FBAR structure of claim 1, wherein the piezoelectric layer comprises a plurality of edges, and the first electrode extends past each of the plurality of edges of the piezoelectric layer.

6. The FBAR structure of claim 1, wherein the one side of the plurality of sides of the cavity has a length that is substantially less than respective lengths of other sides of the plurality of sides of the cavity.

7. The FBAR structure of claim 6, wherein the one side of the plurality of sides of the cavity exists in a recess in the cavity.

8. The FBAR structure of claim 6, wherein the length of the one side is in a range of approximately 30% to approximately 80% of the respective lengths of the other sides.

9. The FBAR structure of claim 4, wherein the piezoelectric layer extends past each of the plurality of edges of the first electrode by a distance in a range of approximately 1.0 μm to approximately 10.0 μm.

10. The FBAR structure of claim 1, wherein the piezoelectric layer comprises a plurality of edges, and the first electrode extends past each of the plurality of edges of the piezoelectric layer by a distance in a range of approximately 0.5 μm to approximately 10.0 μm.

11. The FBAR structure of claim 6, wherein a recess exists in the one side of the plurality of sides of the cavity has a width in a range of approximately 1.0 μm to approximately 20.0 μm.

12. The FBAR structure of claim 1, further comprising a bridge connecting the second electrode to the second connection portion.

13. The FBAR structure of claim 12, wherein a gap is provided beneath the bridge.

14. The FBAR structure of claim 13, wherein the gap is filled with a non-etchable borosilicate glass (NEBSG).

15. The FBAR structure of claim 13, wherein the gap is filled with air.

16. An electrical filter comprising a plurality of FBAR structures, at least one of the plurality of FBAR structures comprising:
   a substrate comprising a cavity having a plurality of sides and a bottom surface, wherein the bottom surface comprises a first portion and a second portion;
   a first electrode disposed over the cavity;
   a first connection portion that connects to the first electrode over only one side of the plurality of sides of the cavity;
   a piezoelectric layer disposed over at least a portion of the first electrode;
   a second electrode disposed over the piezoelectric layer; and
   a second connection portion that connects to the second electrode over only the one side of the plurality of sides that is the same side over which the first connection portion connects to the first electrode, the second connection portion not overlapping the first connection portion, wherein a contacting overlap of the first electrode, the piezoelectric layer and the second electrode provides an active area of the FBAR;
   wherein at least a portion of the first electrode, the piezoelectric layer, and the second electrode are suspended over the first portion of the bottom surface and at least one of the first electrode, the piezoelectric layer, or the second electrode extend up to the second portion of the bottom surface from the one side of the plurality of sides exposing the second portion of the bottom surface.

17. The electrical filter of claim 16, wherein the plurality of FBAR structures are electrically connected to provide a ladder filter.

18. The electrical filter of claim 16, wherein the plurality of FBAR structures are electrically connected to provide a lattice filter.

19. An electronic circuit comprising:
   a substrate comprising a cavity having a plurality of sides and a bottom surface, wherein the bottom surface comprises a first portion and a second portion;
   a first electrode disposed over the cavity;
   a first connection portion that connects to the first electrode over at least one side of the plurality of sides of the cavity;
   a piezoelectric layer disposed over at least a portion of the first electrode;
   a second electrode disposed over the piezoelectric layer; and
   a second connection portion that connects to the second electrode over at least one side of the plurality of sides of the cavity, wherein a contacting overlap of the first electrode, the piezoelectric layer and the second electrode provides an active area;
   wherein at least a portion of the first electrode, the piezoelectric layer, and the second electrode are suspended over the first portion of the bottom surface and at least one of the first electrode, the piezoelectric layer, or the second electrode extend up to the second portion of the bottom surface exposing the second portion of the bottom surface.

20. The electronic circuit of claim 19, wherein the first electrode, the piezoelectric layer, and the second electrode form a first area, wherein a second area of the bottom surface is greater than the first area.

* * * * *